United States Patent [19]
Yoshida et al.

[11] Patent Number: 5,620,922
[45] Date of Patent: Apr. 15, 1997

[54] METHOD FOR FABRICATING CMOS DEVICE HAVING LOW AND HIGH RESISTANCE PORTIONS AND WIRE FORMED FROM A SINGLE GATE POLYSILICON

[75] Inventors: Yoshifumi Yoshida; Shinichi Yoshida; Yutaka Saitoh; Jun Osanai, all of Chiba, Japan

[73] Assignee: Seiko Instruments Inc., Japan

[21] Appl. No.: 414,003

[22] Filed: Mar. 17, 1995

[30] Foreign Application Priority Data

Mar. 18, 1994 [JP] Japan .................................. 6-49310
Mar. 14, 1995 [JP] Japan .................................. 7-54724

[51] Int. Cl.[6] .................................................. H01L 21/70
[52] U.S. Cl. ..................... 438/210; 257/350; 257/380; 438/238; 438/385; 438/659
[58] Field of Search ........... 437/60, 918; 148/DIG. 136; 257/350, 379, 380

[56] References Cited

U.S. PATENT DOCUMENTS

| | | | |
|---|---|---|---|
| 4,208,781 | 6/1980 | Rao et al. | 437/60 |
| 4,265,685 | 5/1981 | Seki | 437/60 |
| 4,408,385 | 10/1983 | Rao et al. | 437/60 |
| 4,516,313 | 5/1985 | Turi et al. | 437/918 |
| 4,549,340 | 10/1985 | Nagasawa et al. | 437/60 |
| 4,560,419 | 12/1985 | Bouassa et al. | 437/918 |
| 4,682,402 | 7/1987 | Yamaguchi | 148/DIG. 136 |
| 4,902,640 | 2/1990 | Sachitano et al. | 257/380 |
| 5,059,549 | 10/1991 | Furuhata | 437/59 |
| 5,134,088 | 7/1992 | Zetterlund | 437/918 |
| 5,196,233 | 3/1993 | Chan et al. | 437/60 |
| 5,198,382 | 3/1993 | Campbell et al. | 437/60 |
| 5,256,589 | 10/1993 | Hozumi | 437/60 |
| 5,268,323 | 12/1993 | Fischer et al. | 437/57 |
| 5,304,502 | 4/1994 | Hanagasaki | 437/918 |
| 5,348,901 | 9/1994 | Chen et al. | 437/60 |
| 5,418,179 | 5/1995 | Hotta | 437/57 |
| 5,489,547 | 2/1996 | Erdeljac et al. | 437/60 |

FOREIGN PATENT DOCUMENTS

| | | |
|---|---|---|
| 114491 | 8/1984 | European Pat. Off. . |
| 450503 | 10/1991 | European Pat. Off. . |
| 450503A2 | 10/1991 | European Pat. Off. . |
| 3107543 | 12/1981 | Germany . |
| 401128560 | 5/1989 | Japan ..................................... 257/380 |

OTHER PUBLICATIONS

IEEE Electron Device Letters, vol. 14, No. 5, May 1993, pp. 222–224, J.C. Hsieh et al., "Characteristics of MOS Capacitors of $BF_2$ or B Implanted Polysilicon Gate with and without $POCL_3$ Co–doped".

EEE Electron Device Letters, vol. 12, No. 3, Mar. 1991, pp. 128–130, James S. Cable et al., "Impurity Barrier Properties of Reoxidized Nitrided Oxide Films for Use with $p^+$–Doped Polysilicon Gates".

Patent Abstracts Of Japan, vol. 14, No. 429 (E–0978), 14 Sep. 1990.

IEEE Electron Device Letter, vol. 14, No. 5, May 1993, New York, pp. 222–224, J.C. Hsieh et al. "Characteristics of MOS Capacitors of $BF_2$ or B Implanted Polysilicon Gate with and without $POCl_3$ Co–doped".

*Primary Examiner*—John Niebling
*Assistant Examiner*—Long Pham
*Attorney, Agent, or Firm*—Adams & Wilks

[57] ABSTRACT

A method for fabricating a semiconductor device having a high-resistance polysilicon and low-resistance polysilicon on the surface of a substrate comprises forming a gate oxide film on the substrate, forming a polysilicon film on the gate oxide film, and simultaneously forming a resistance, a wire, and a gate electrode from the polysilicon film by etching using a resist as a mask. Impurities are introduced into the polysilicon for controlling a resistance value thereof to form the high-resistance polysilicon resistance through ion implantation. Impurities are also introduced into the polysilicon to form the low-resistance polysilicon wire through ion implantation. N-type impurities are introduced into the gate electrode of a PMOS transistor and the source and drain regions of the PMOS transistor through ion implantation. P-type impurities are introduced into the gate electrode of an NMOS transistor and the source and drain regions of the NMOS transistor through ion implantation.

16 Claims, 29 Drawing Sheets

FIG. 1
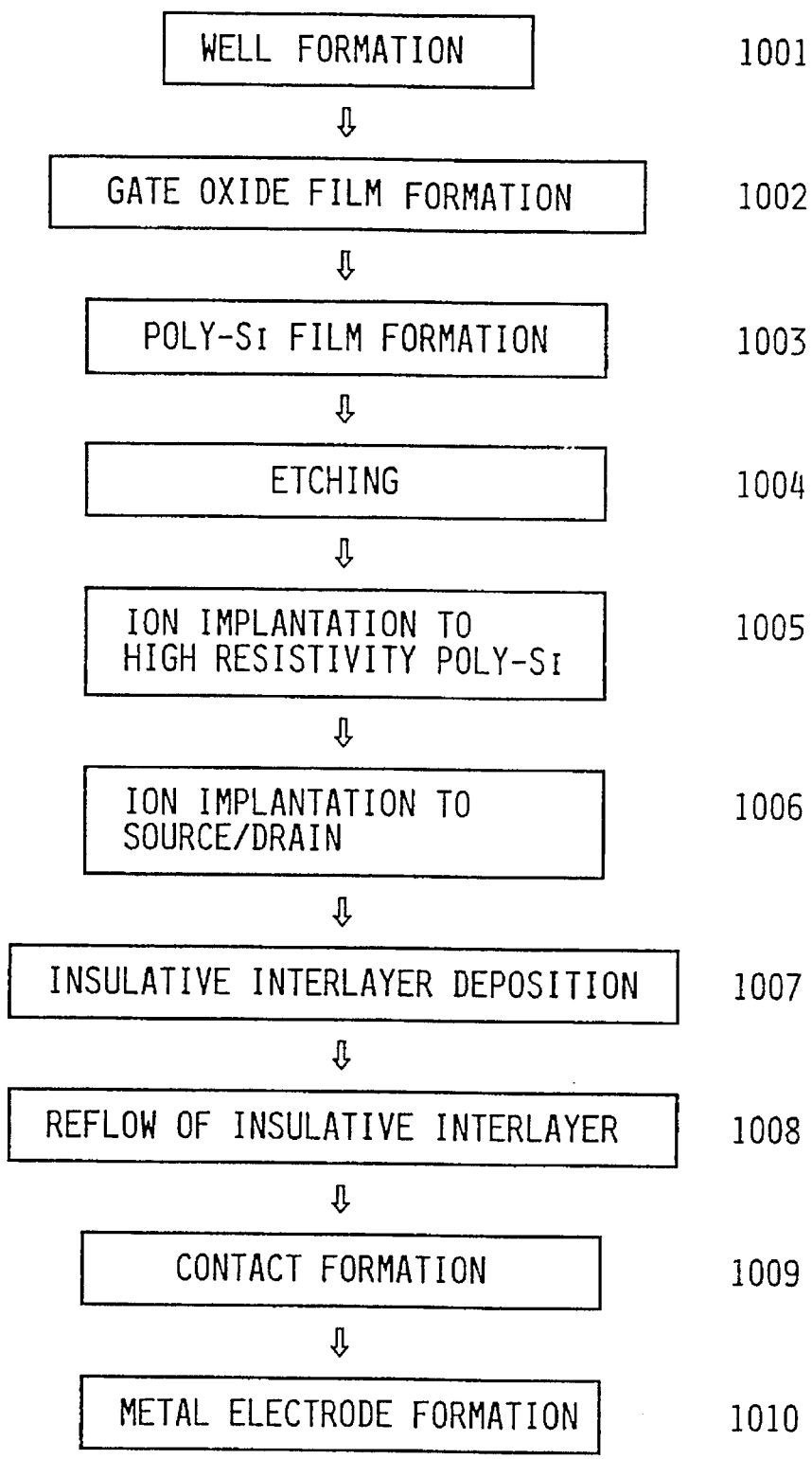

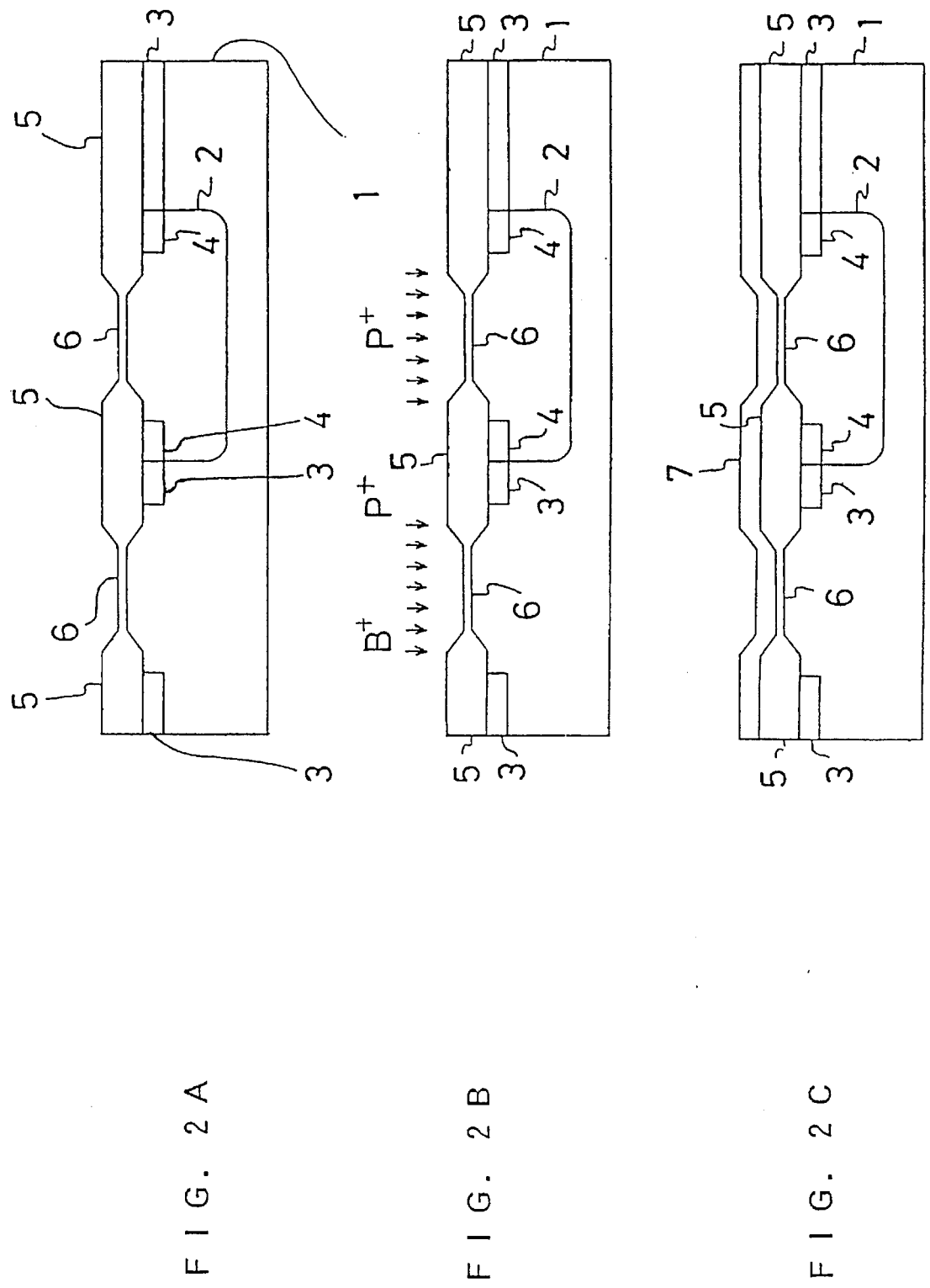

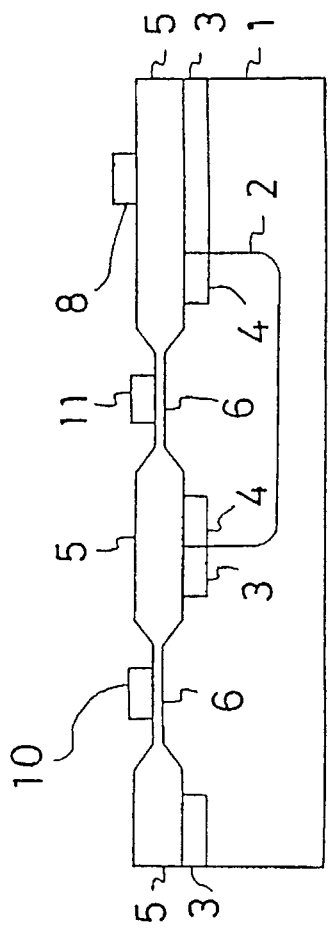
FIG. 2D
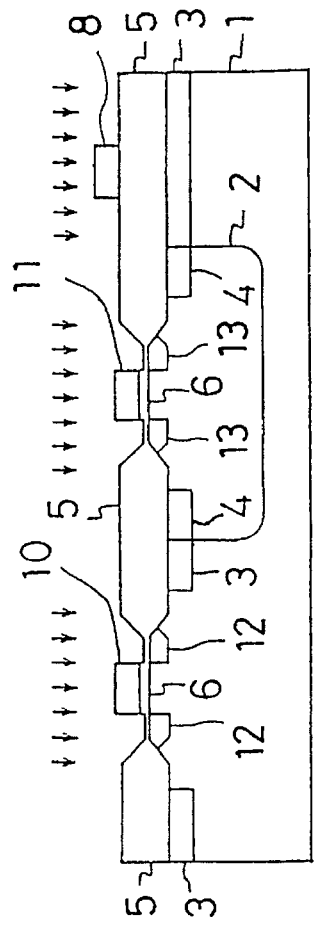
FIG. 2E
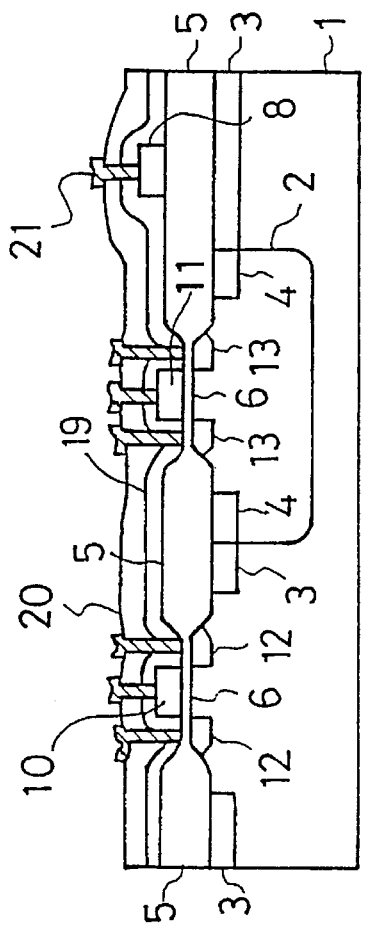
FIG. 2F

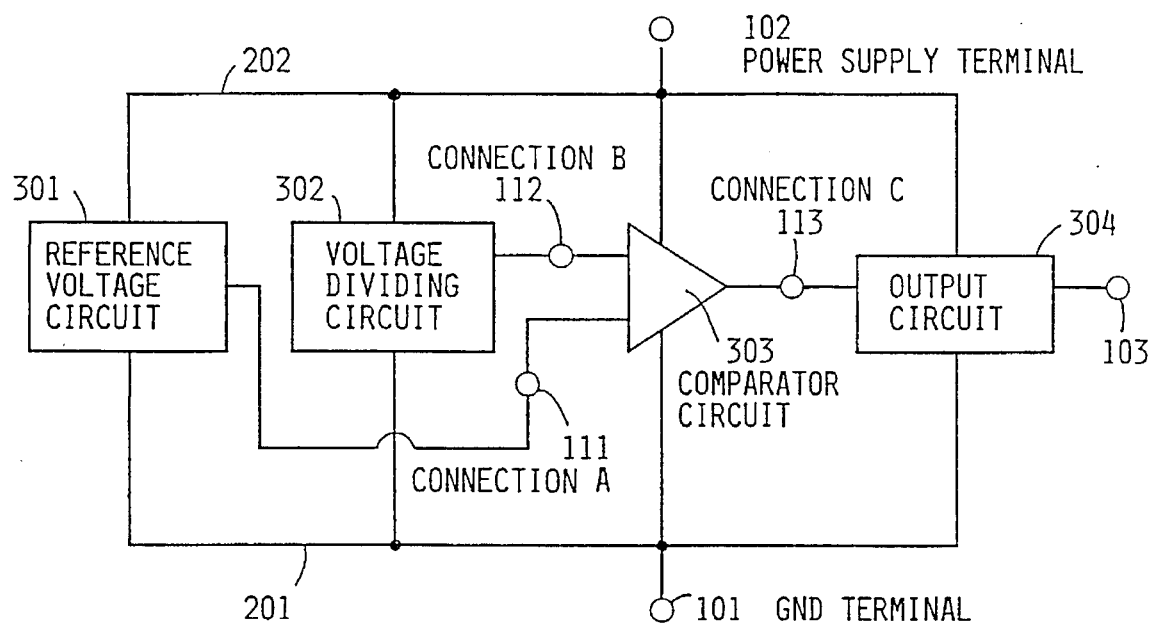
FIG. 3

FIG. 4
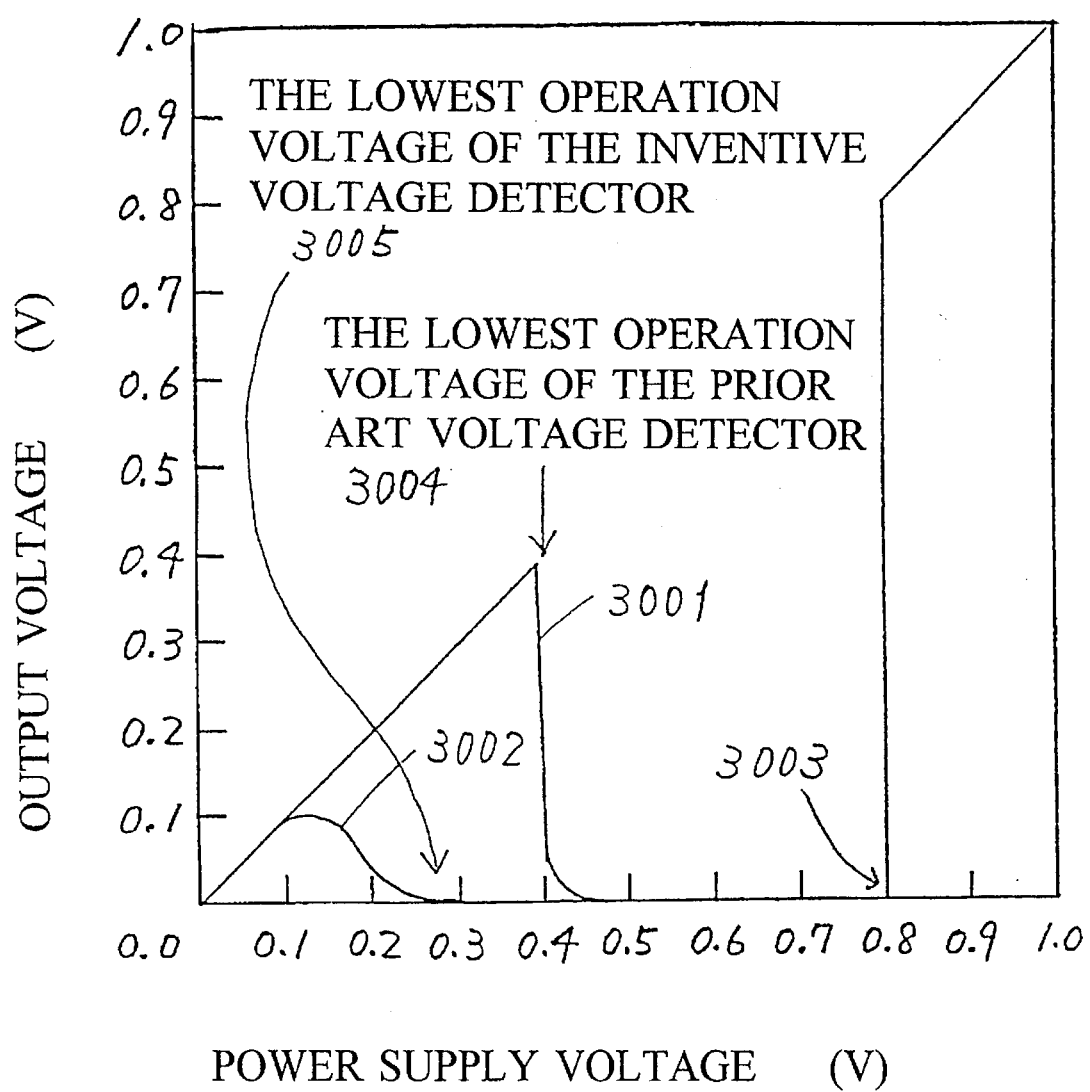

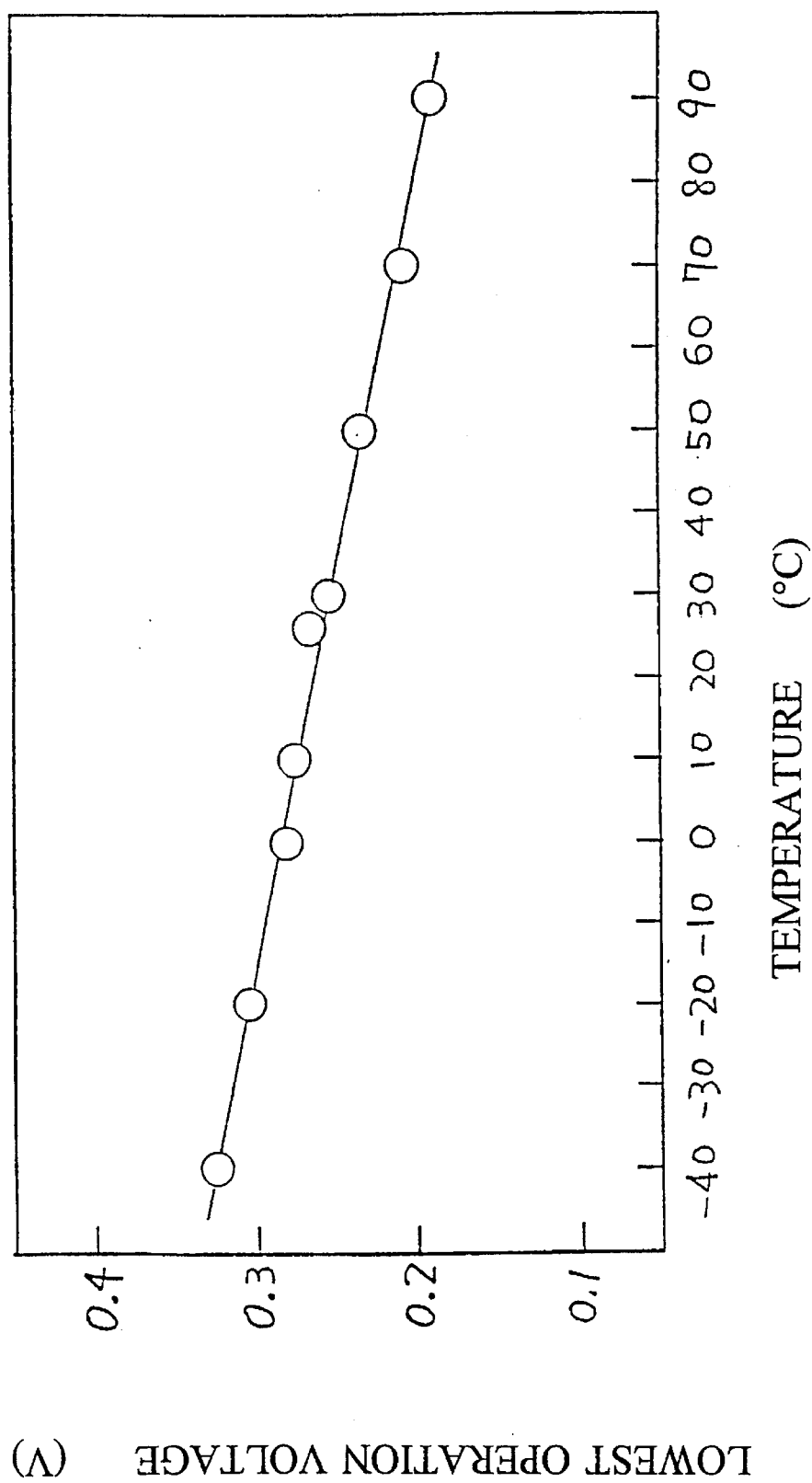
FIG. 5

F I G. 6
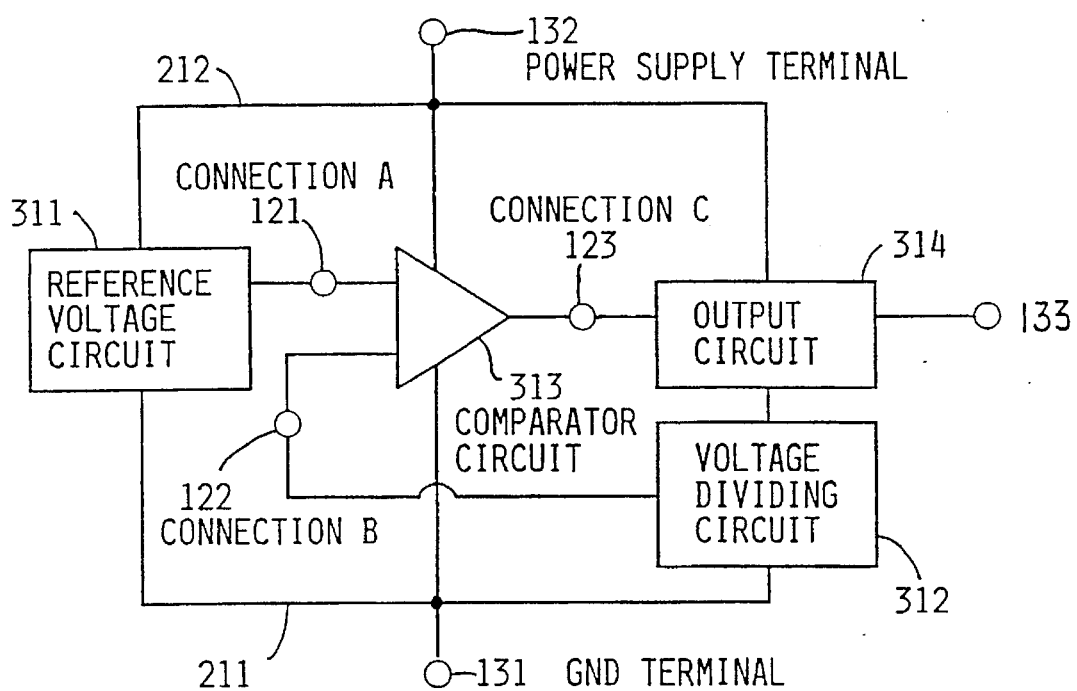

FIG. 7
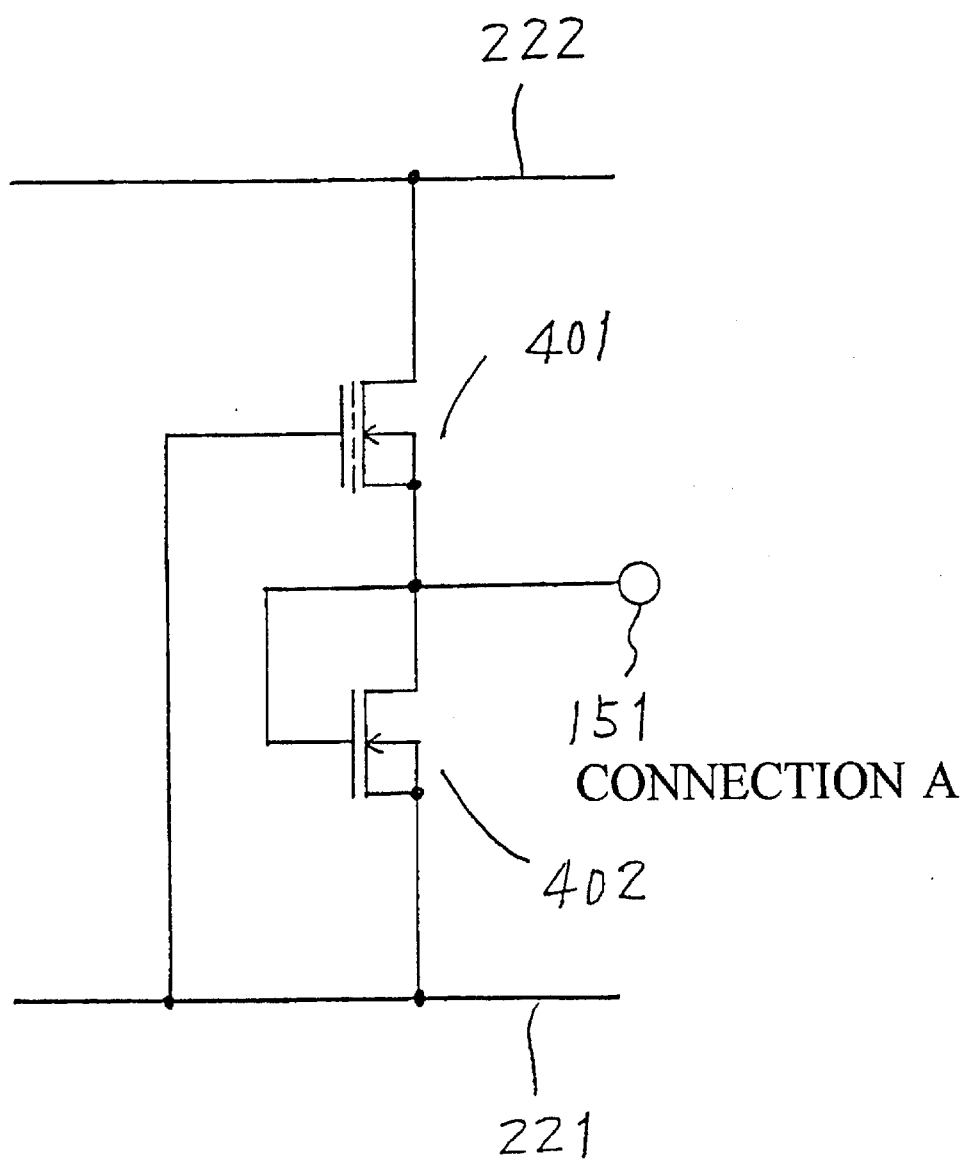

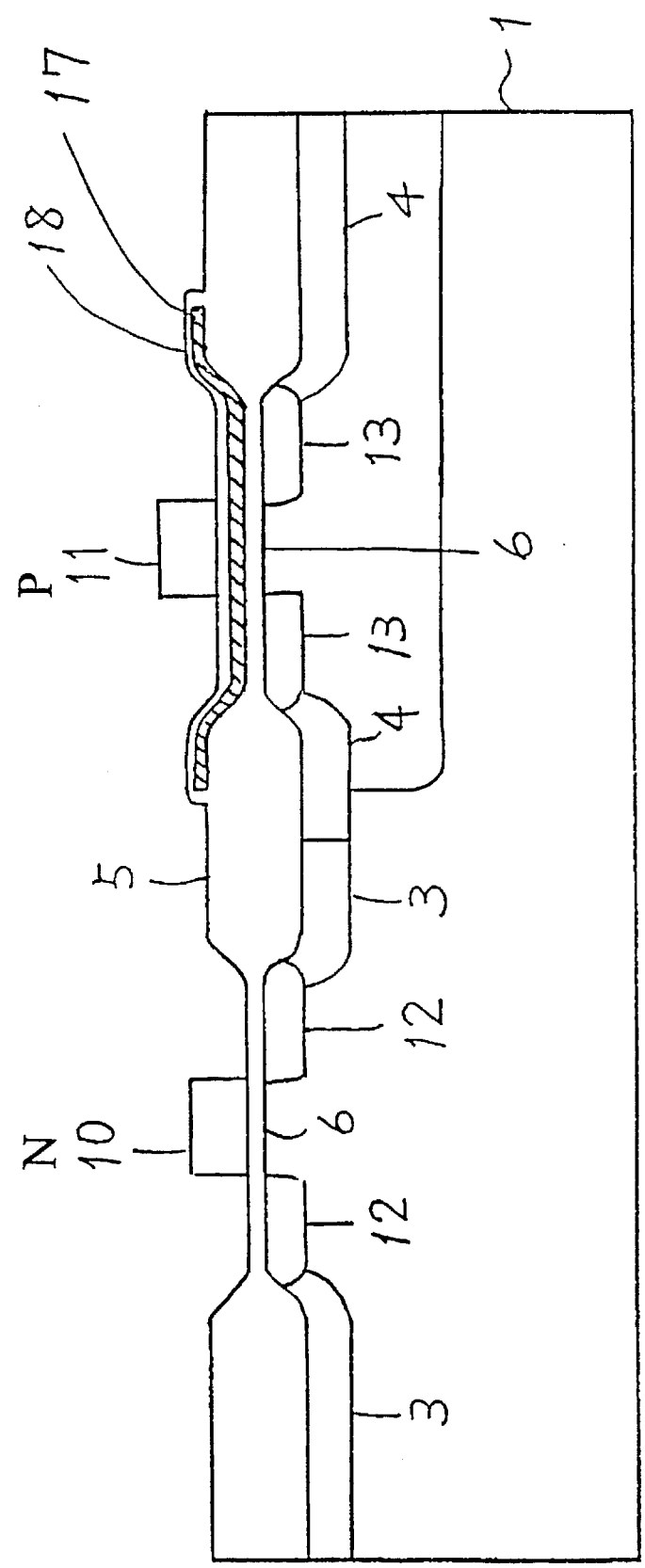
FIG. 8

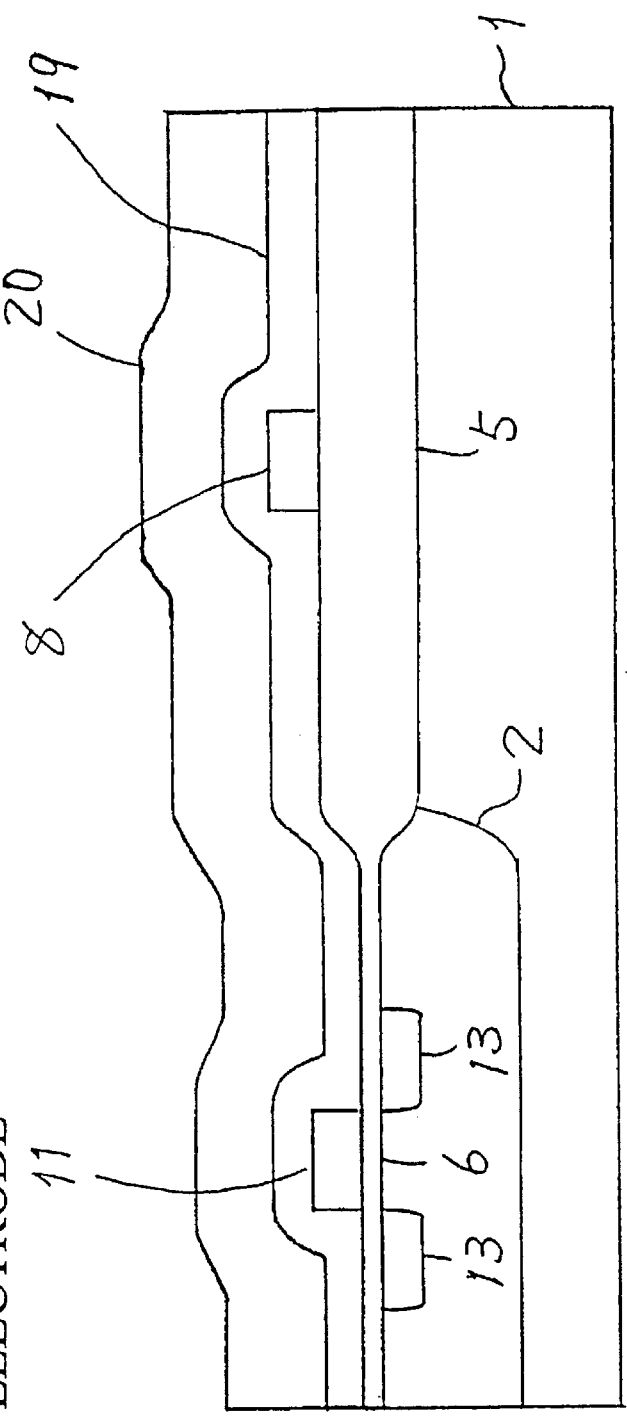
FIG. 9

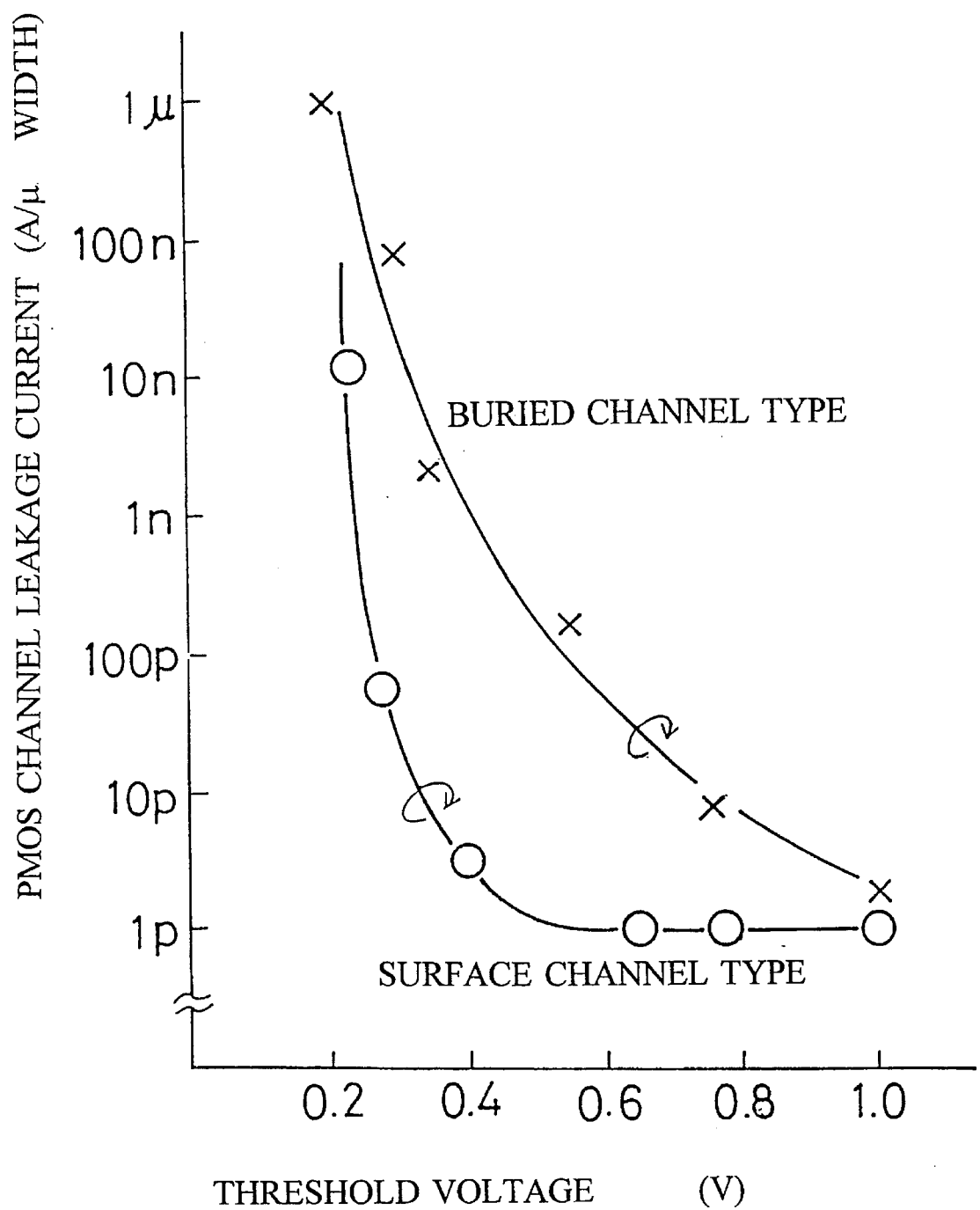
FIG. 10

FIG. 11
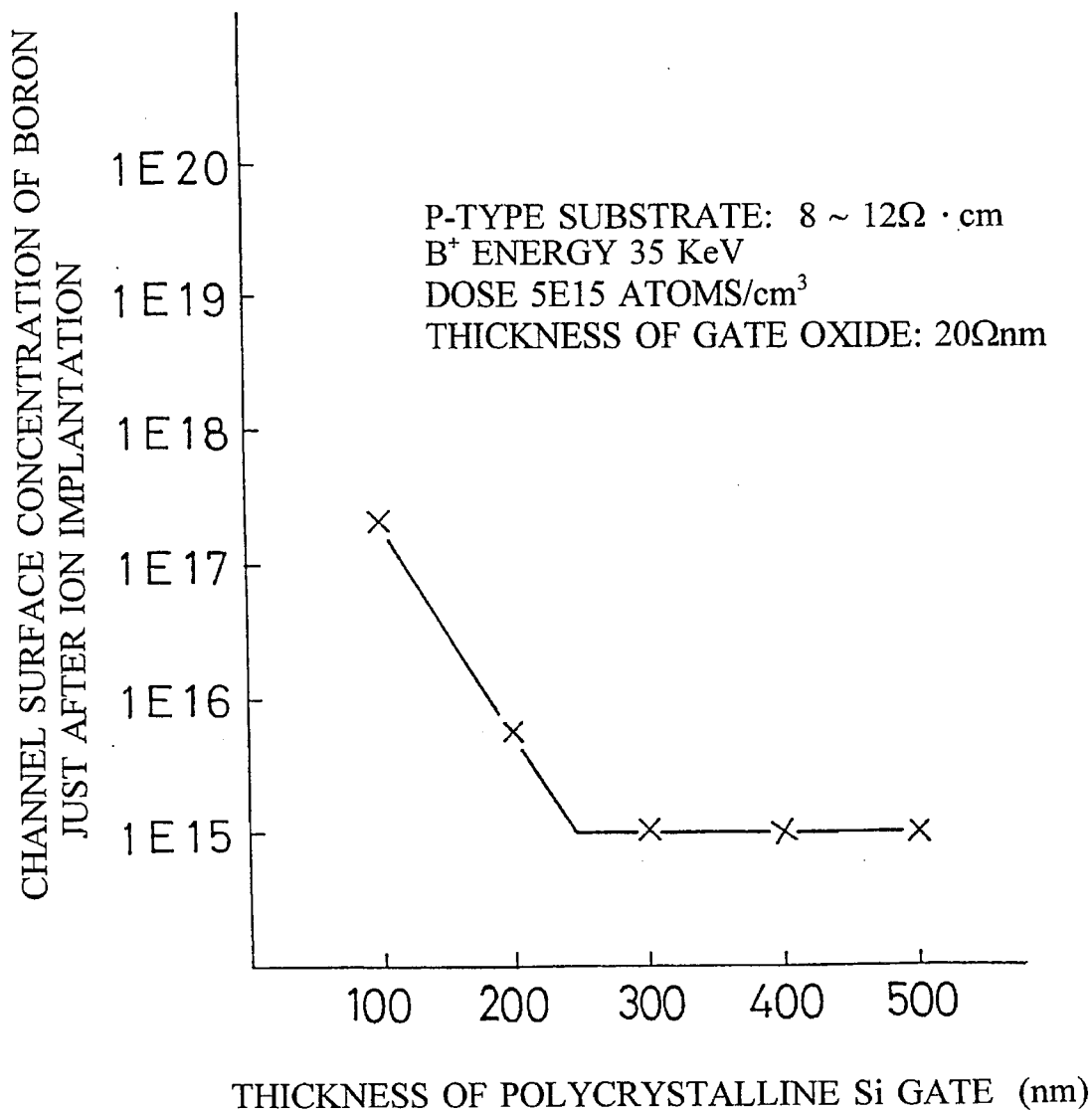

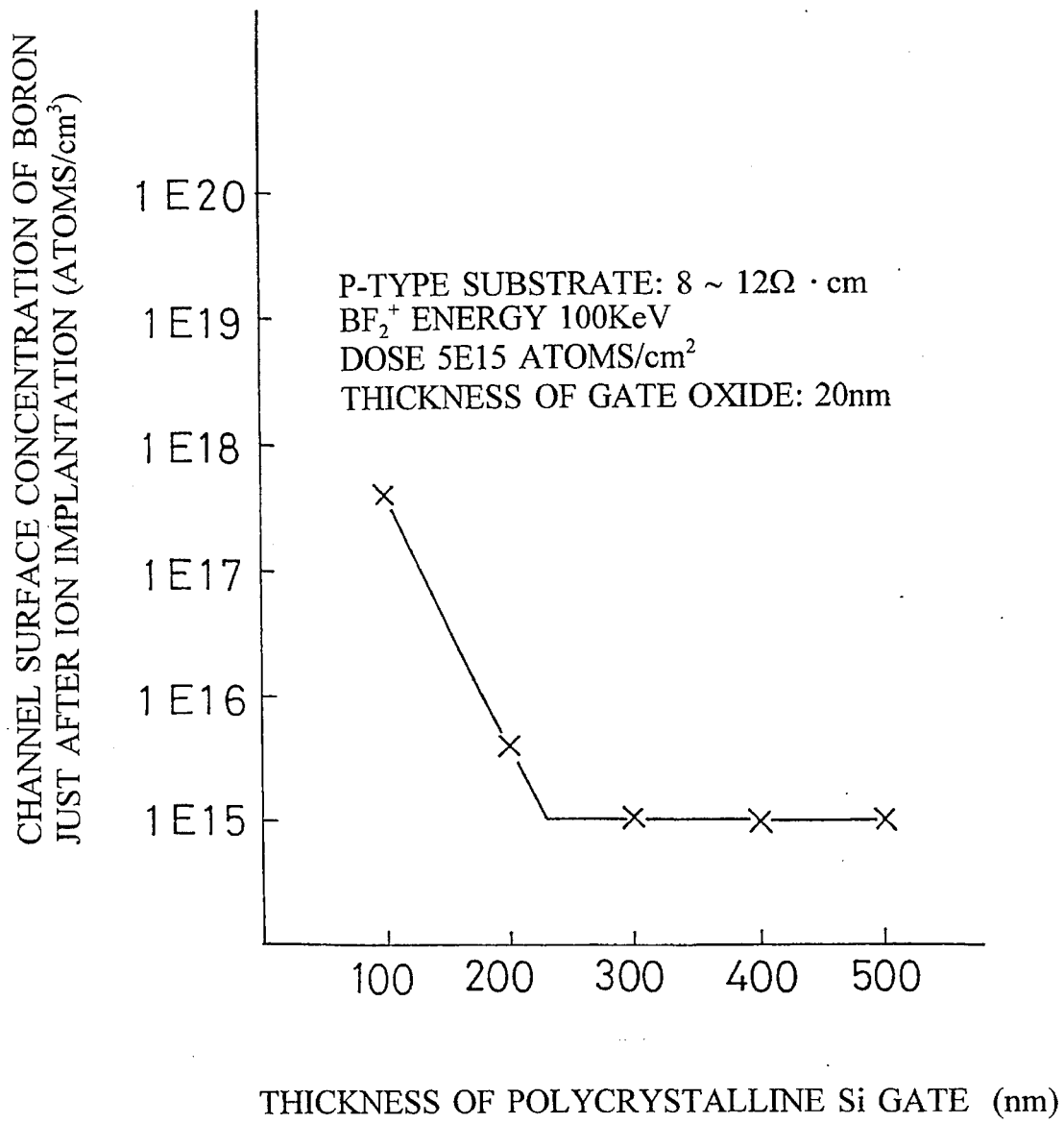
FIG. 12

FIG. 13
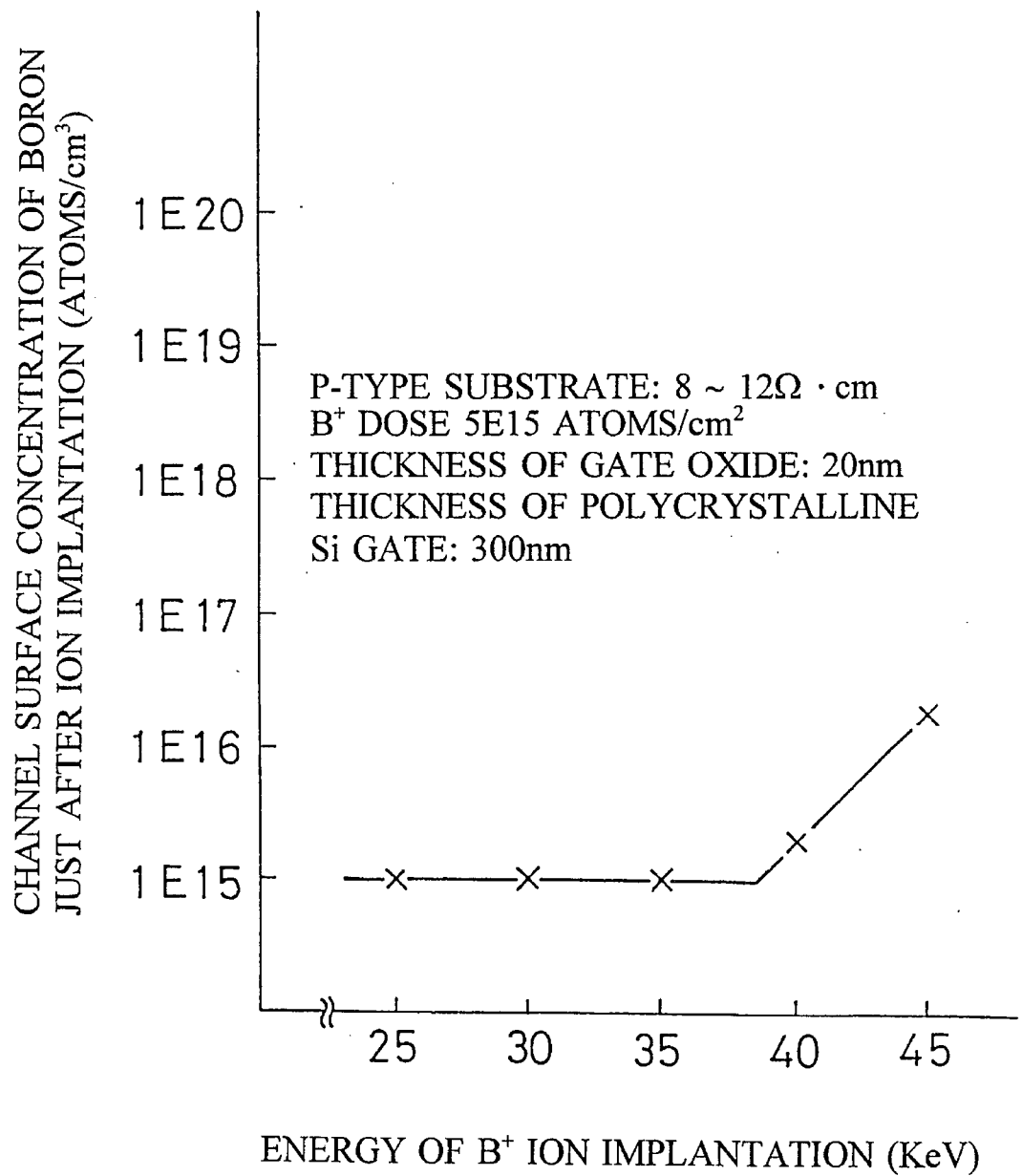

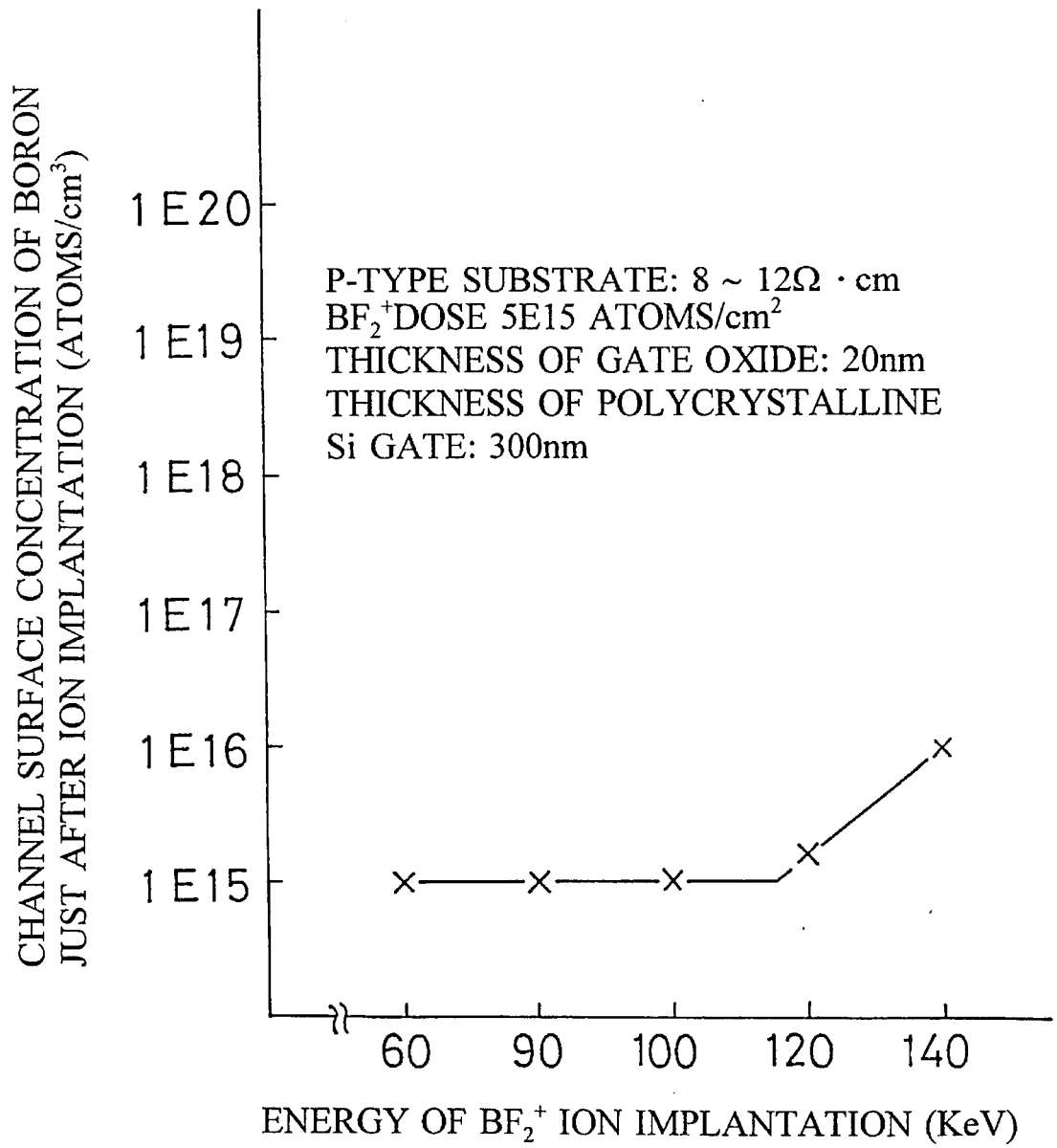
FIG. 14

FIG. 15
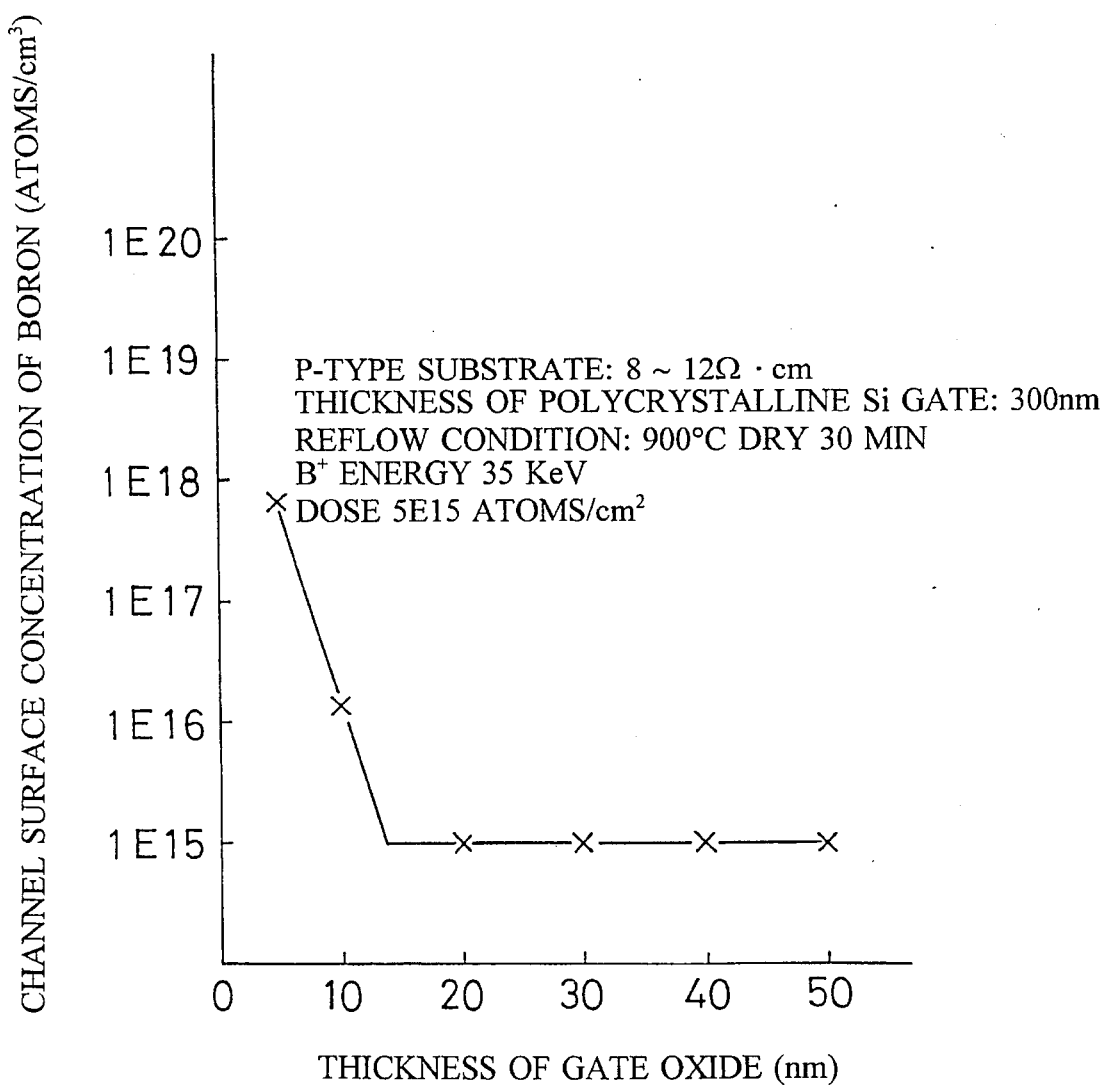

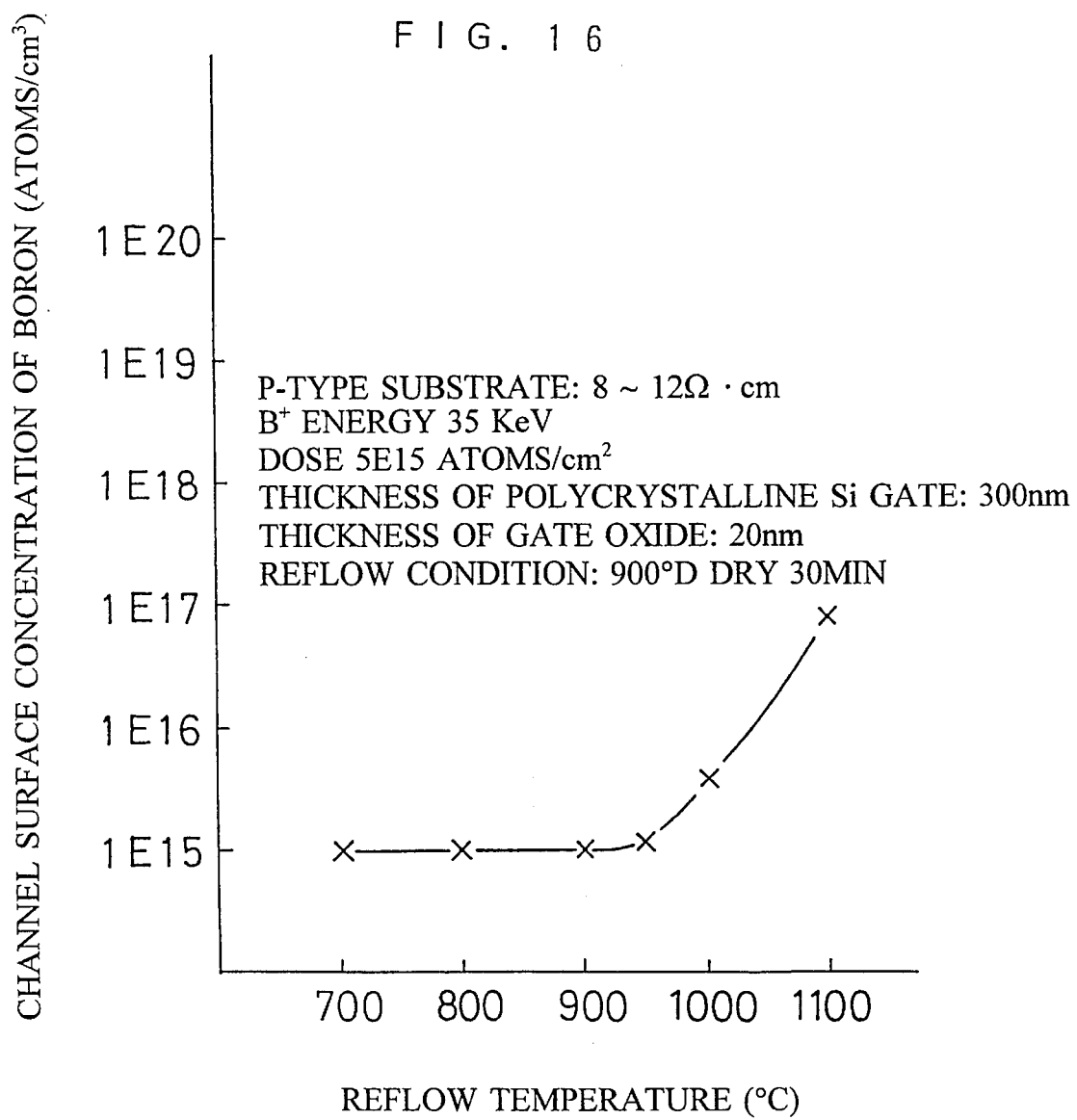

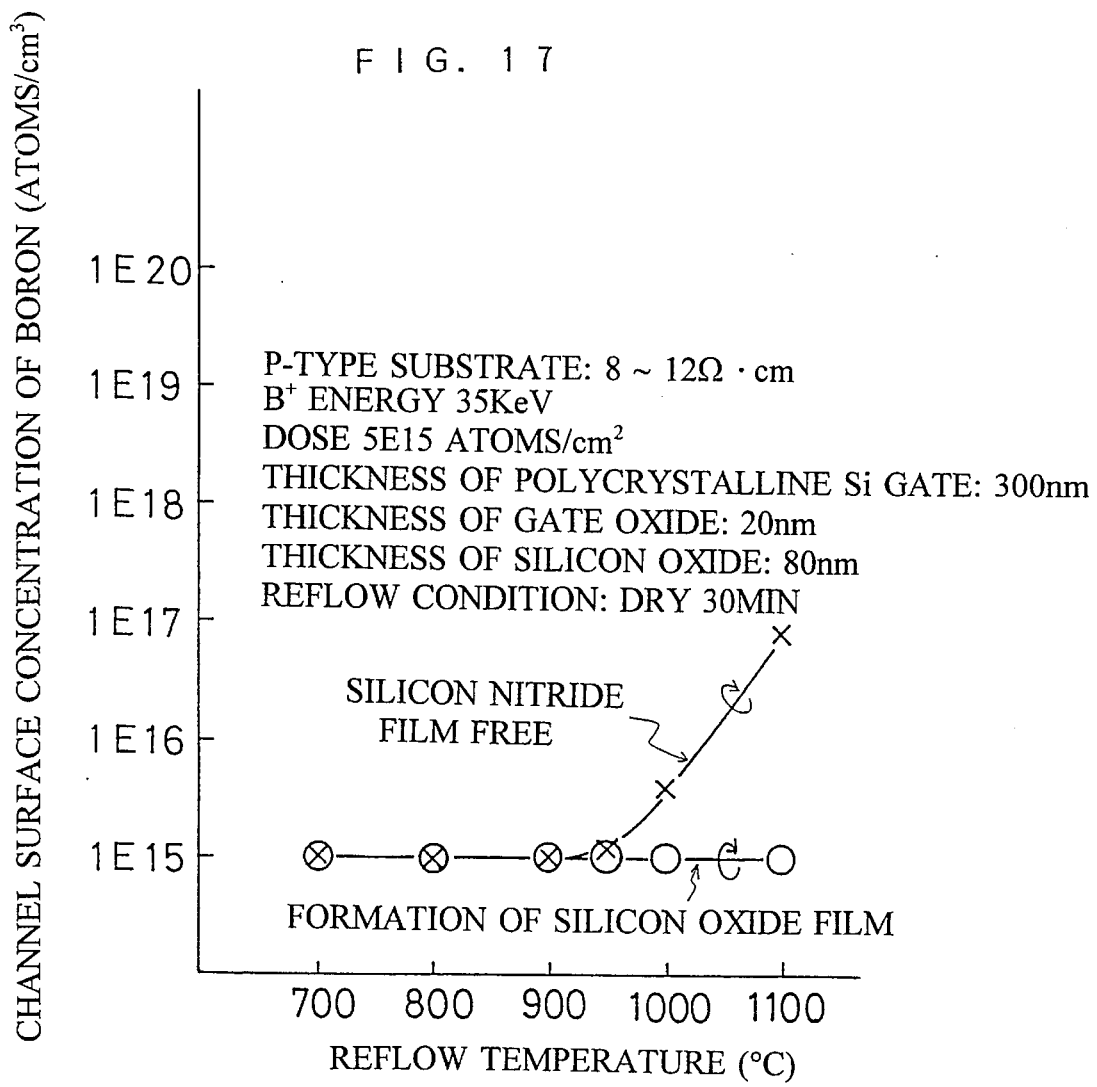

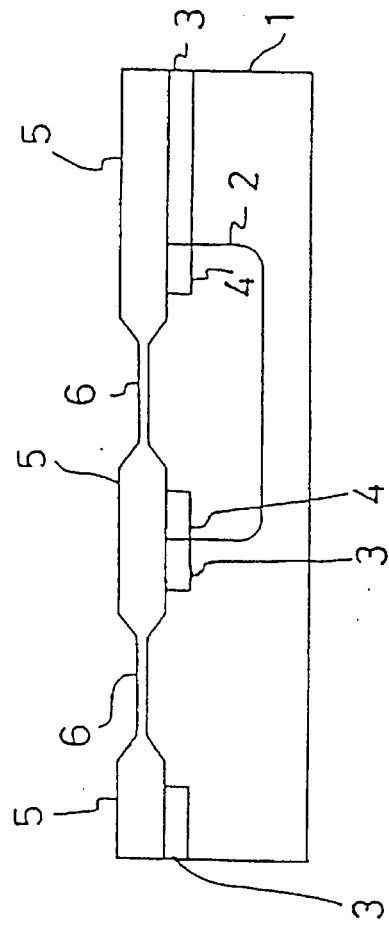
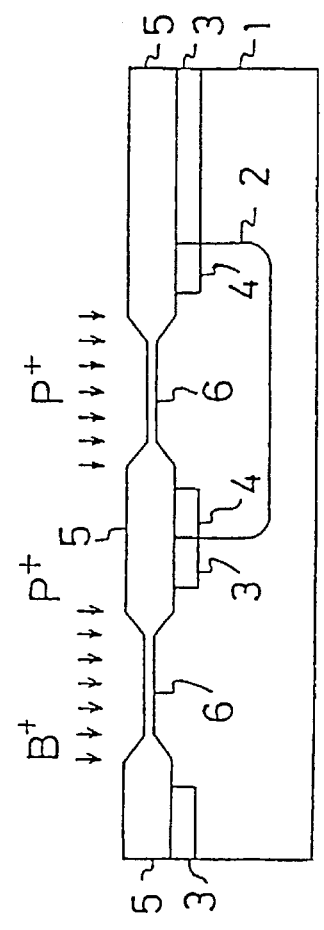
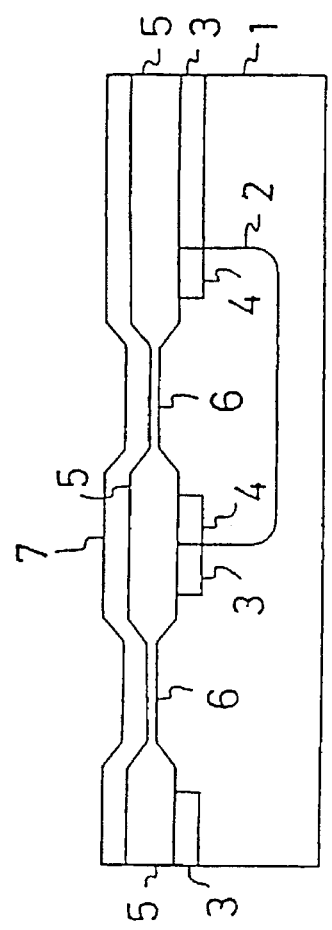
FIG. 18A
FIG. 18B
FIG. 18C

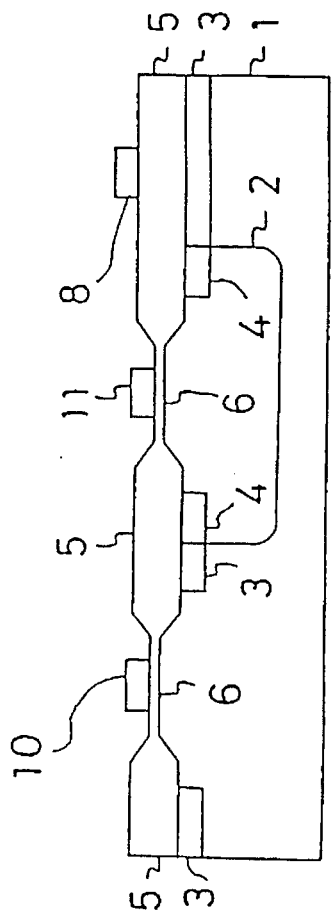
FIG. 18D
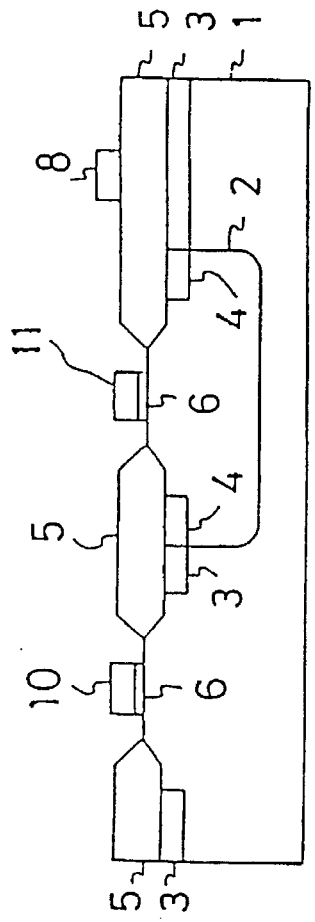
FIG. 18E
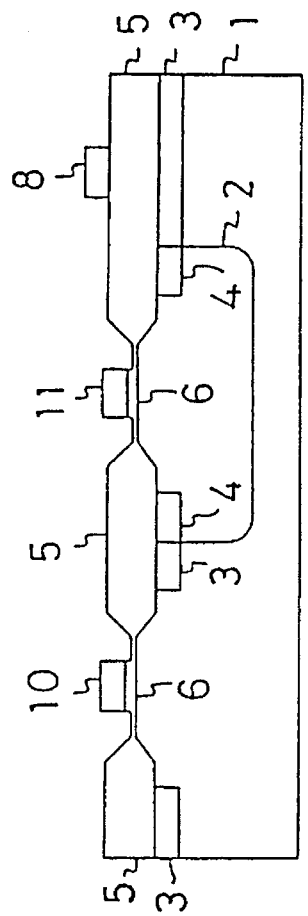
FIG. 18F

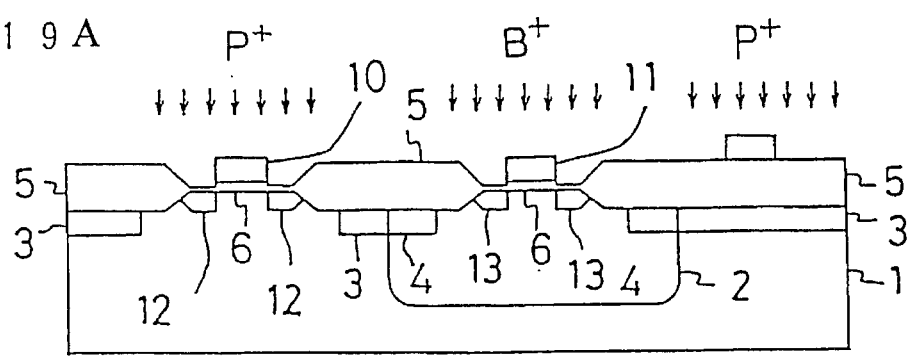
FIG. 19A
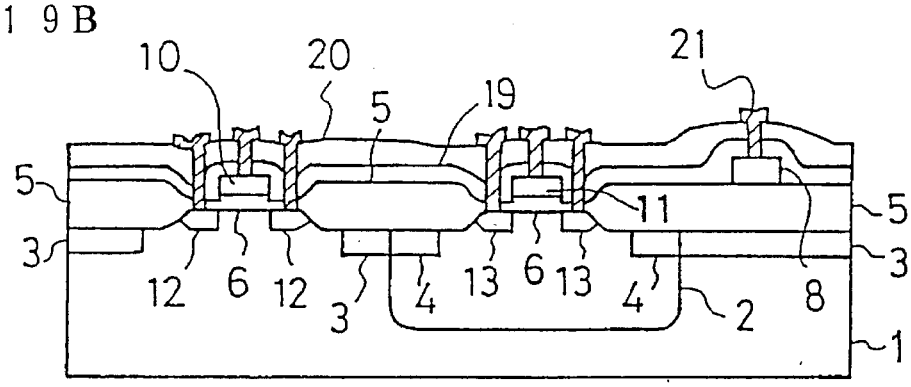
FIG. 19B

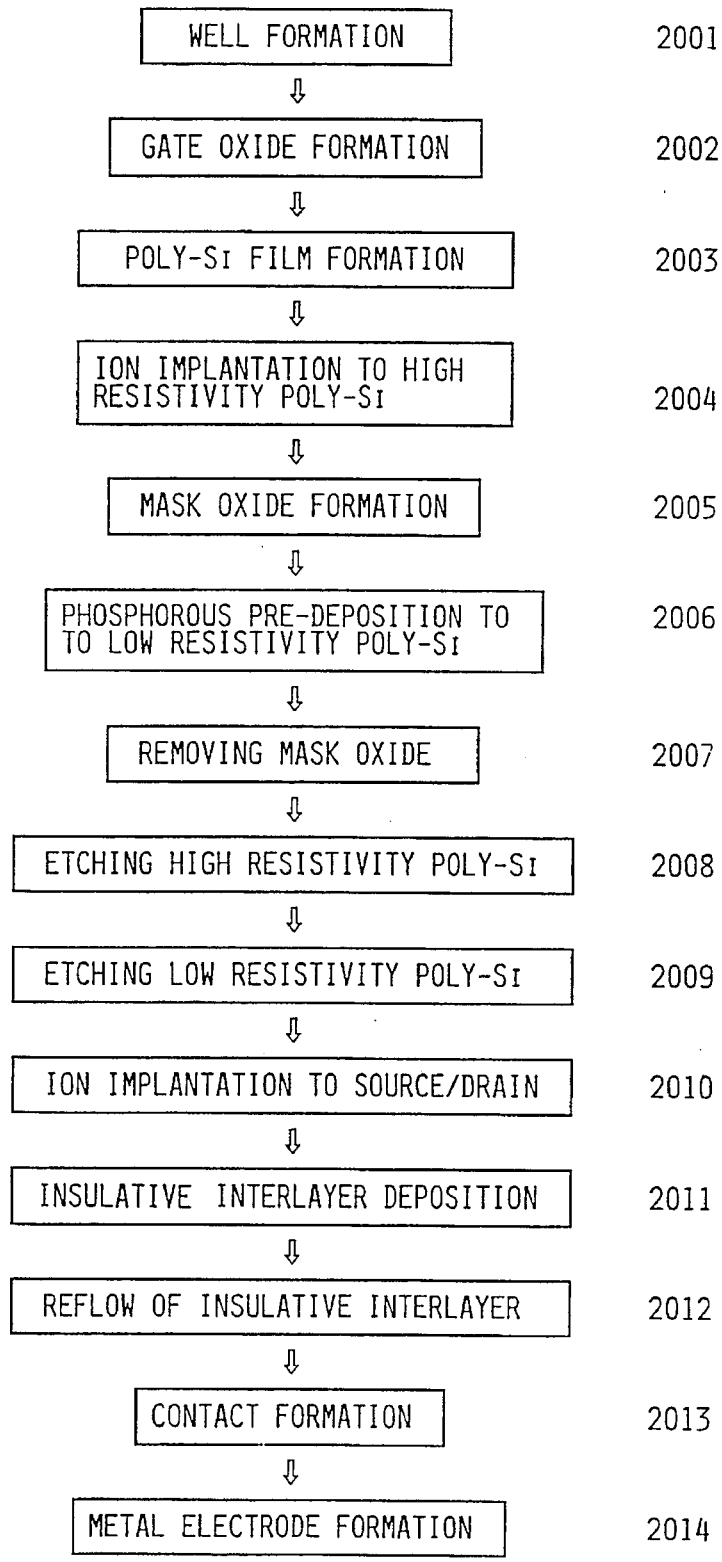
FIG. 20
PRIOR ART

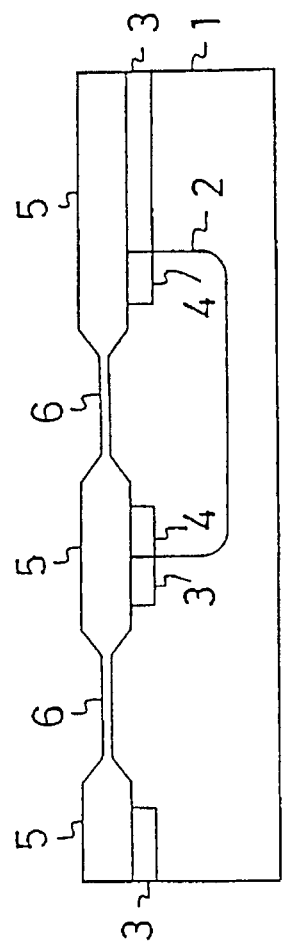
PRIOR ART
FIG. 21A
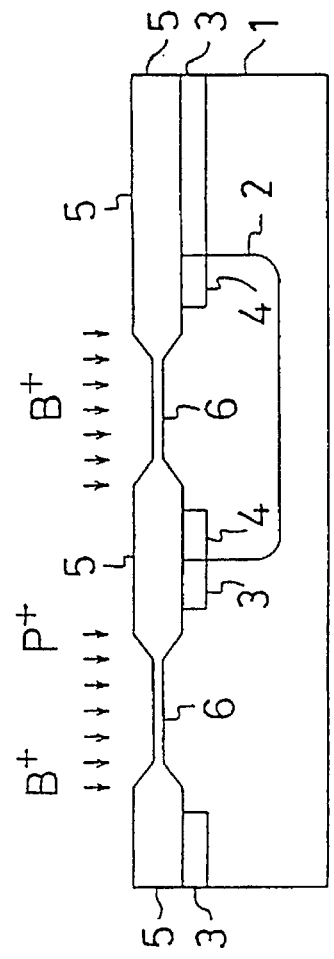
PRIOR ART
FIG. 21B
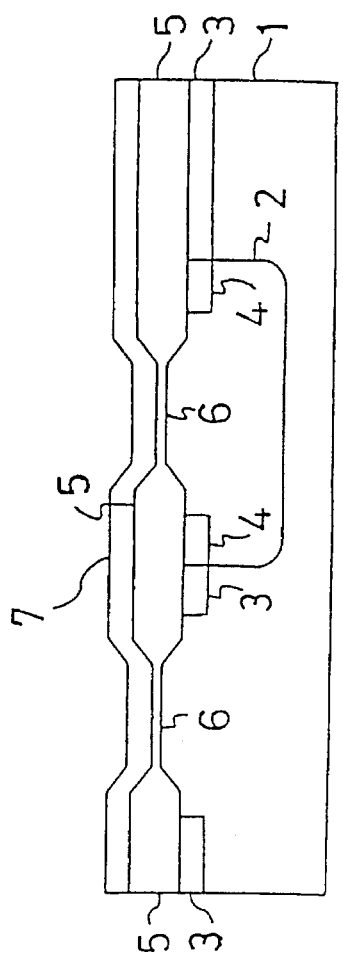
PRIOR ART
FIG. 21C

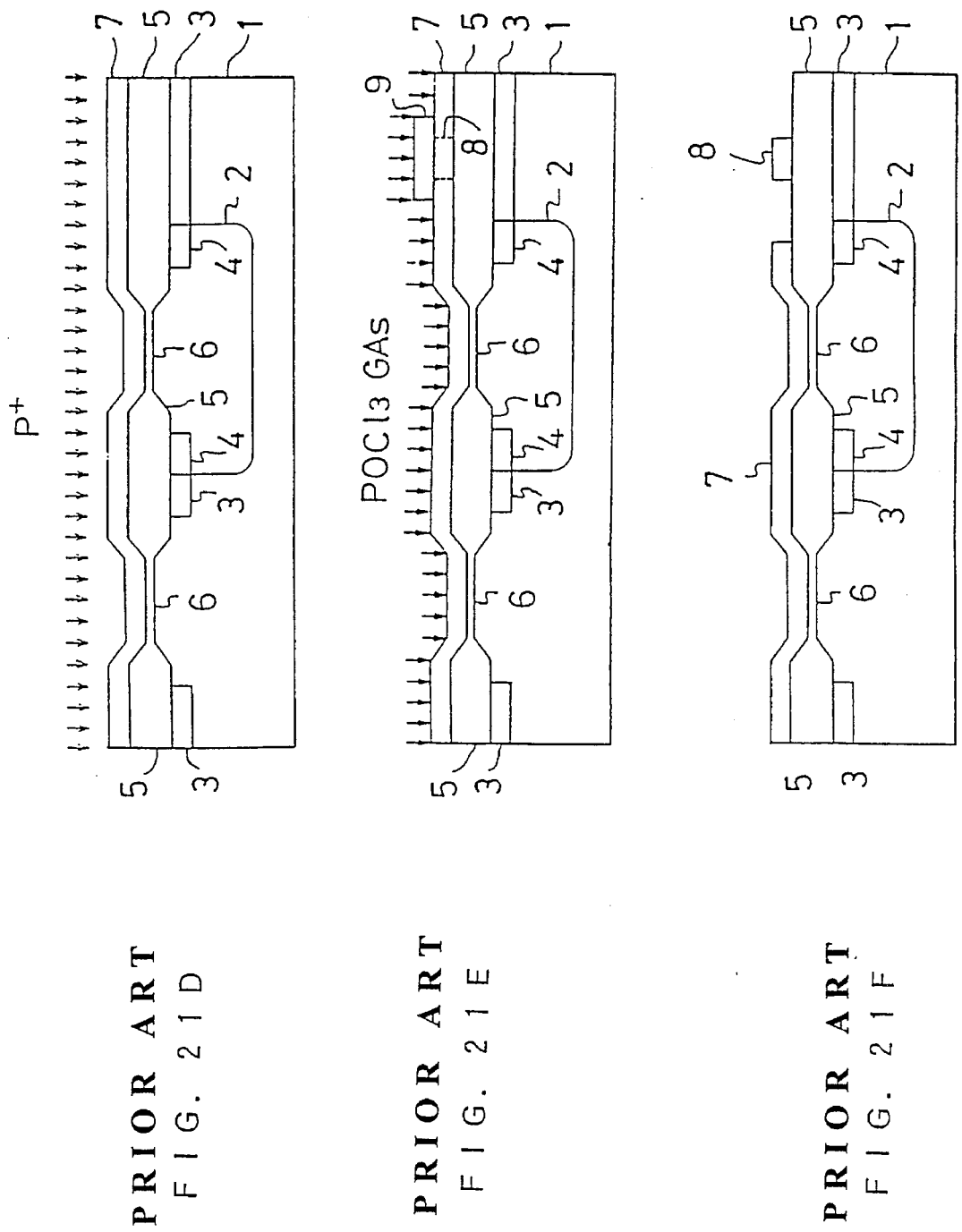
PRIOR ART
FIG. 21D
PRIOR ART
FIG. 21E
PRIOR ART
FIG. 21F

PRIOR ART
FIG. 22A
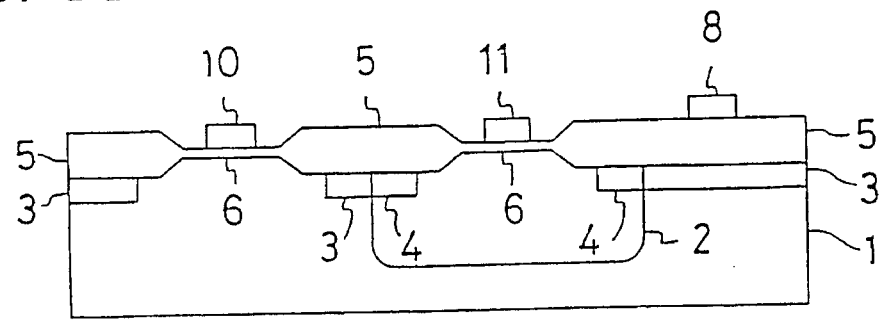
PRIOR ART
FIG. 22B
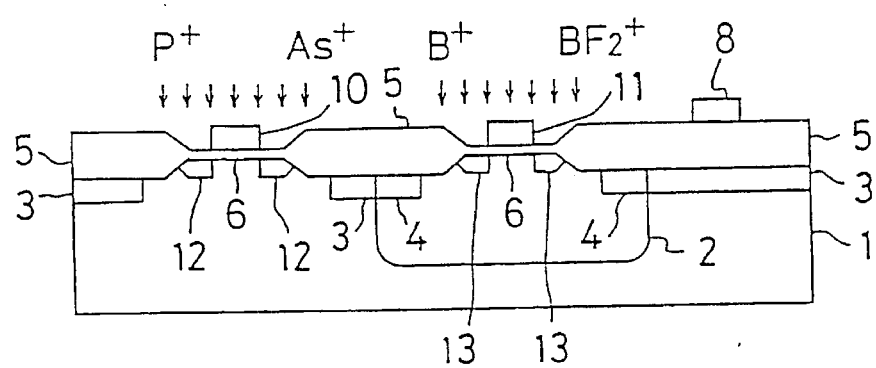
PRIOR ART
FIG. 22C
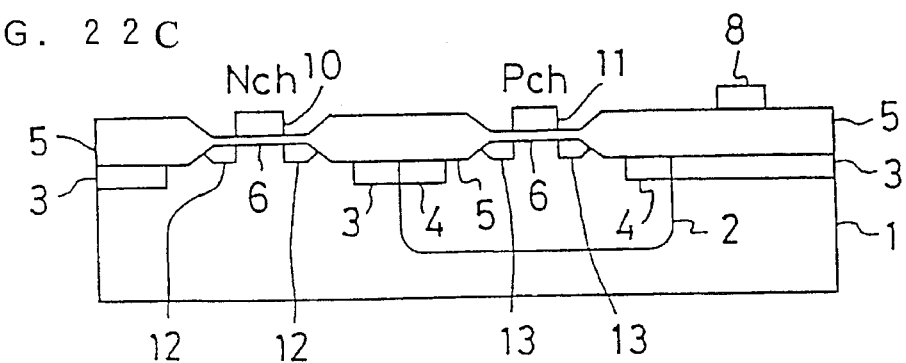

PRIOR ART
FIG. 23
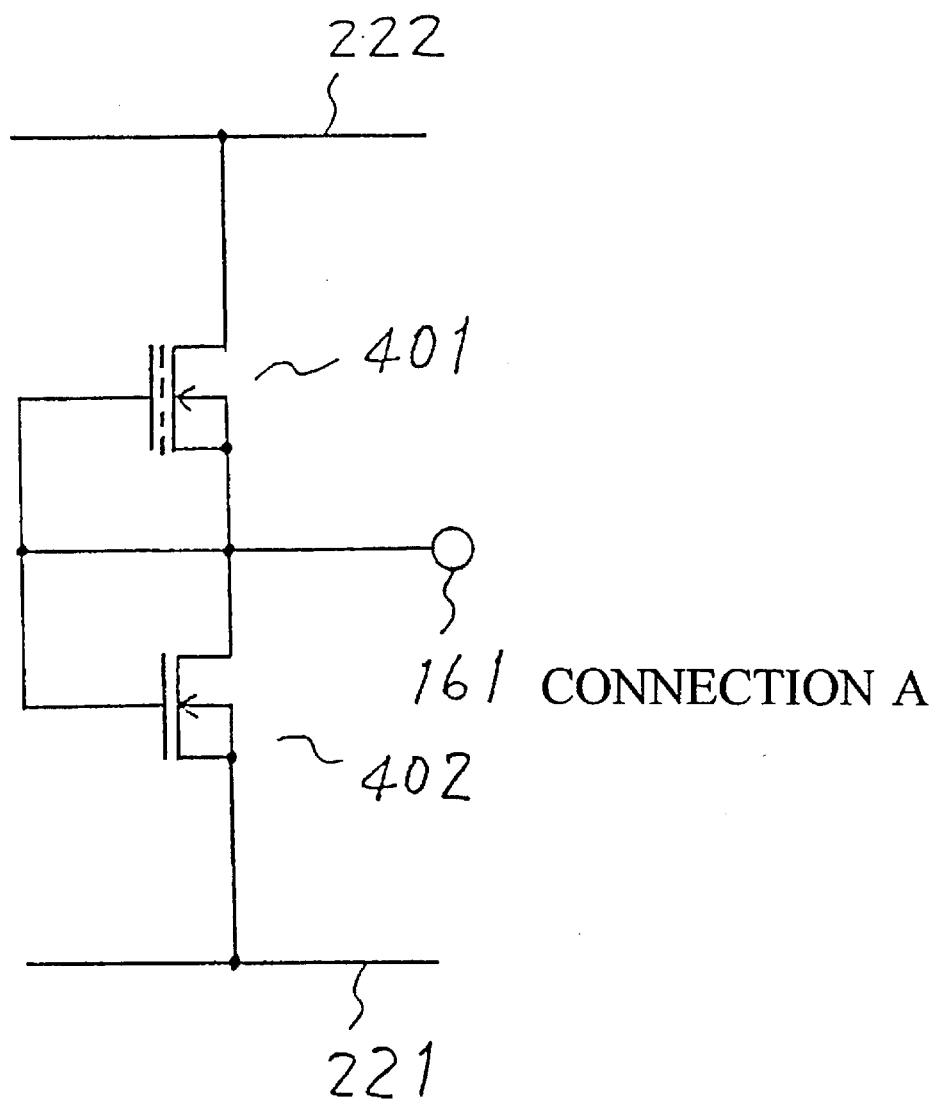

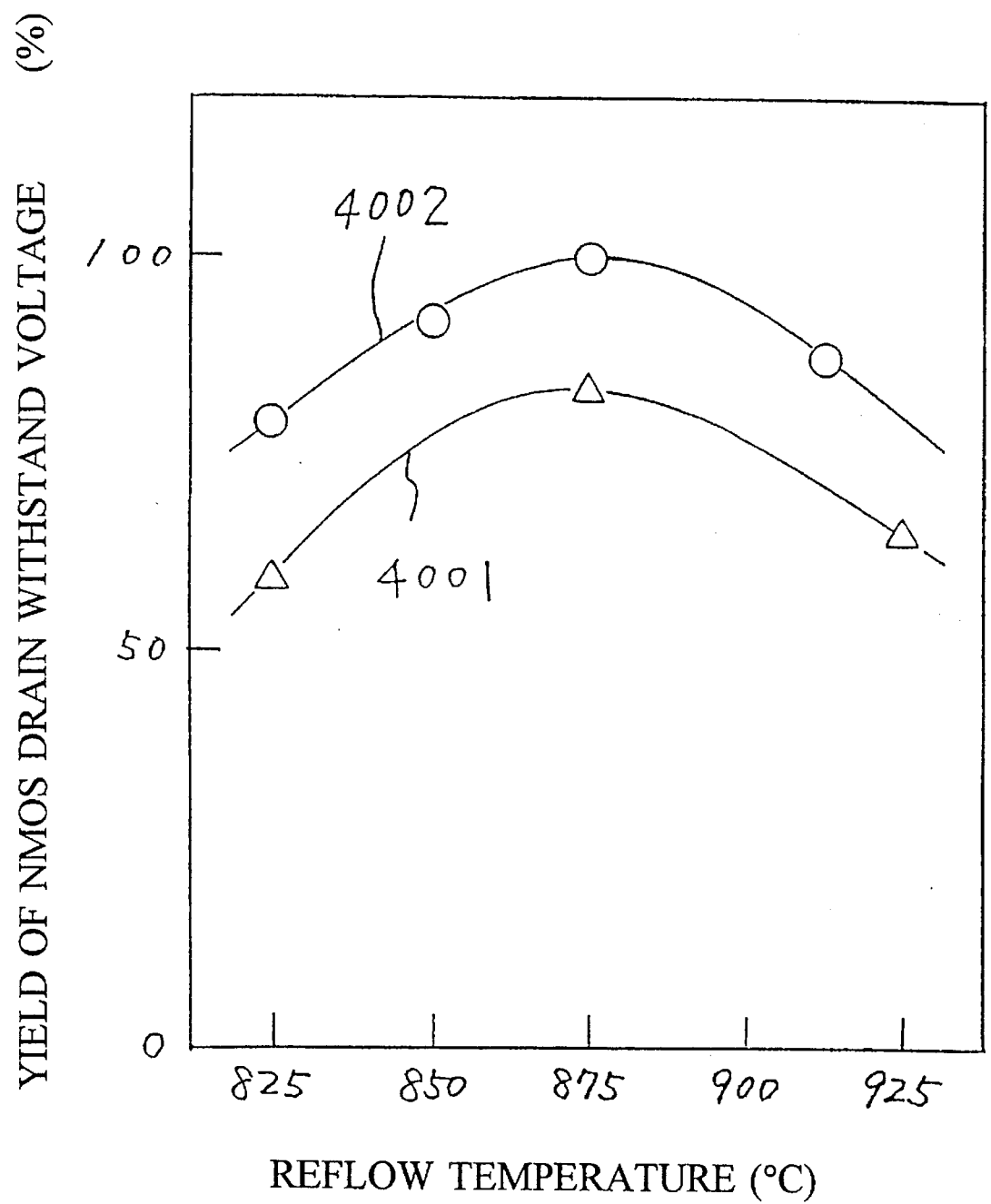
FIG. 24

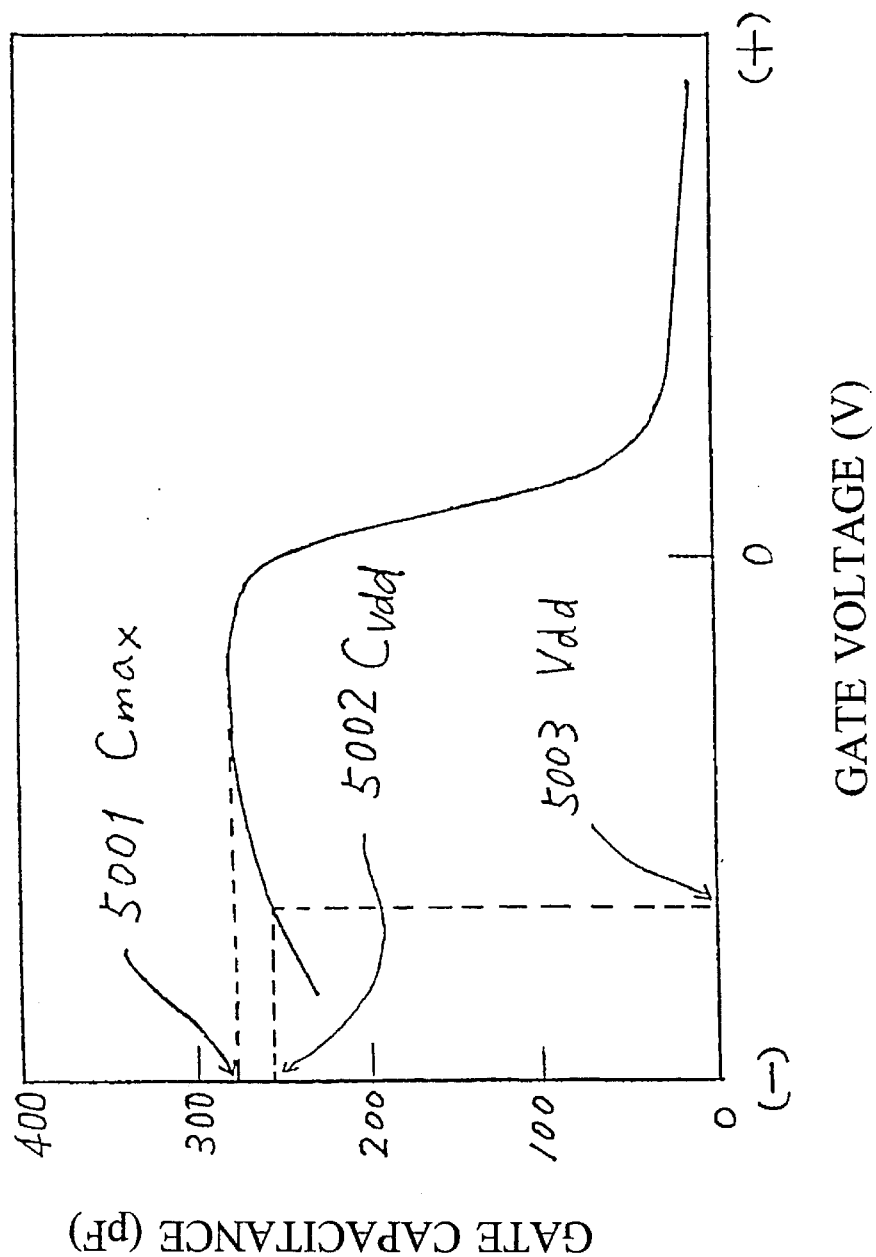
FIG. 25

FIG. 26
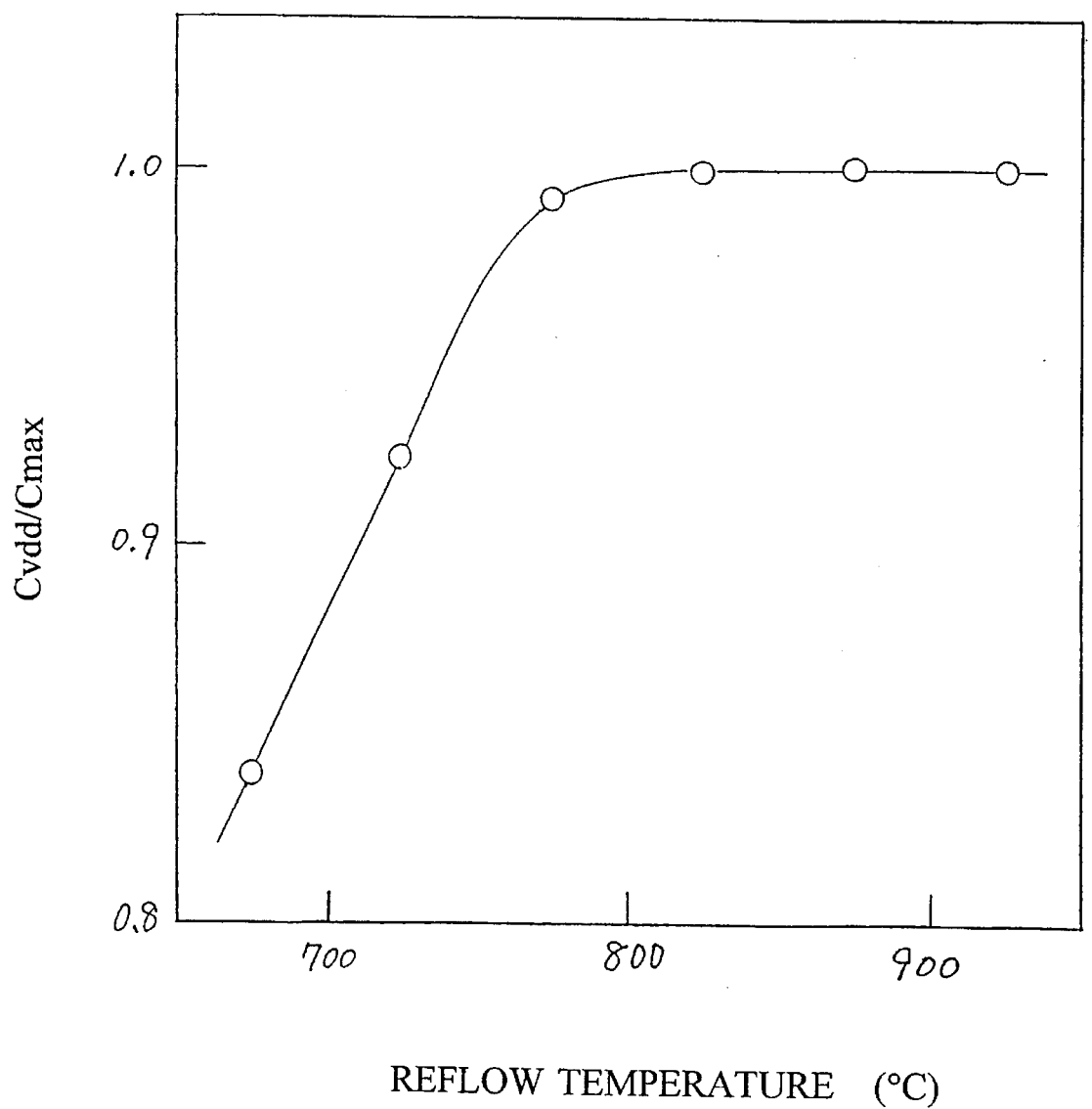
REFLOW TEMPERATURE (°C)

5,620,922

METHOD FOR FABRICATING CMOS DEVICE HAVING LOW AND HIGH RESISTANCE PORTIONS AND WIRE FORMED FROM A SINGLE GATE POLYSILICON

BACKGROUND OF THE INVENTION

The present invention relates to lowering of the voltage of a power-supply semiconductor integrated circuit.

An existing voltage detector or voltage regulator comprising a CMOS transistor uses an N-type gate electrode for the gate electrode of an NMOS transistor of the CMOS transistor and an N-type gate electrode for the gate electrode of a PMOS transistor of the CMOS transistor.

FIG. 3 shows a circuit block diagram of a voltage detector. The voltage detector comprises a reference voltage circuit 301; a voltage division circuit 302, a voltage comparison circuit 303, and an output circuit 304. The reference voltage circuit 301 comprises a depression-type NMOS transistor 20 and an enhancement-type NMOS transistor which mutually connect in series between a power supply line 202 and an earthing line 201 and has a function for outputting a constant voltage to the joint A 111. The voltage division circuit 302 comprises a plurality of series resistances connected between the power supply line 202 and the earthing line 201 and has a function for dividing a power supply voltage by using a joint B 112 as a separating point. The voltage comparison circuit 303 comprises PMOS transistors and NMOS transistors, which are connected between the power supply line 202 and the earthing line 201, connects with the reference voltage circuit 301 at the joint A 111 and with the voltage division circuit 302 at the joint B 112, compares the voltage difference between the joint A 111 and the joint B 112 and has a function of outputting a voltage equal to a power supply voltage to a joint C 113 when the voltage at the joint B 112 is lower than the voltage at the joint A 111.

The output circuit 304 comprises an inverter constituted by combining a PMOS transistor with an NMOS transistor, in which the source of the PMOS transistor connects with the power supply line 202,, the drain of the PMOS transistor connects with the drain of the NMOS transistor, and the source of the NMOS transistor connects with the earthing line 201.

The voltage comparison circuit 303 and the gate electrode of the inverter are connected to each other at the joint C 113. When the output of the voltage comparison circuit 303 is received by the gate electrodes of the PMOS and NMOS transistors, the drain joint between the PMOS and NMOS transistors has a function of outputting a voltage that equals to the power supply voltage.

A detection voltage is that equals determined by the reference voltage which is outputted by the reference voltage circuit 301 and the ratio of the resistance of high-resistance polisilicon, and a desired output voltage can be obtained by a polysilicon fuse built. Moreover, high-resistance polysilicon with a high resistance value is used to decrease current consumption and the high-resistance polysilicon and a CMOS transistor are indispensable components for a CMOS power supply IC.

The voltage detector has a function for decreasing an output voltage to 0 V when the power supply voltage is equal to the detection voltage or lower (e.g. 0.8 V or lower).

FIG. 6 shows a circuit block diagram of the voltage regulator. The voltage regulator comprises a reference voltage circuit 311, a voltage division circuit 312, a voltage comparison circuit 313, and an output circuit 314. The reference voltage circuit 311 comprises a depression-type NMOS transistor and an enhancement-type NMOS transistor which mutually connect in series between a power supply 212 and an earthing line 211 and has a function of a constant output voltage to the joint A 121.

The voltage division circuit 312 comprises a plurality of series resistances connected between the power supply line 212 and the earthing line 211, and has a function of dividing a power supply voltage by using a joint B 122 as a separating point.

The voltage comparison circuit 313 comprises PMOS transistors and NMOS transistors, which are connected between the power supply line 212 and the earthing line 211, and connects with the reference voltage circuit 311 at the joint A 121 and with the voltage division circuit 312 at the joint B 122, and compares the voltage difference between the joint A 121 and the joint B 122 and has a function of outputting the gate controlled voltage to the output circuit 314.

The output circuit 314 comprises a PMOS transistor or an NMOS transistor. When the output circuit 314 comprises the PMOS transistor, it is constituted so as to connect the source with the power supply line 212 and the drain of the PMOS with a voltage division circuit 312.

When the output circuit 314 comprises the NMOS transistor, it is constituted so as to connect the drain with the power supply line 212 and the source of the NMOS transistor with the voltage division circuit 312.

Moreover, the output circuit 314 is constituted so as to connect the voltage comparison circuit 313 with the gate electrode of the PMOS or NMOS transistor at the joint C 123 and receive the output of the voltage comparison circuit 313 by the gate electrode of the PMOS or NMOS transistor, and has a function of outputting a voltage to an output terminal 133 connected to the drain of the PMOS transistor or the source of the NMOS transistor.

The voltage regulator has a function of continuously outputting constant output voltage even if a power supply voltage or a load fluctuates.

FIG. 23 shows an existing reference voltage circuit used for a voltage detector or voltage regulator. The reference voltage circuit comprises a depression-type NMOS transistor 401 and an enhancement type NMOS transistor 402 which mutually connect in series between a power supply line 222 and an earthing line 221 and has a function of outputting a constant output voltage to the joint A 161.

The depression-type NMOS transistor 401 connects the gate with the source to equalize the potential with that of a substrate and connects the source with the drain of the enhancement-type NMOS transistor. The enhancement-type NMOS transistor 402 connects the gate with the drain to equalize the potential of the substrate with that of the source.

Moreover, the drain of the depression-type NMOS transistor 401 connects with the power supply line 222, the source of the enhancement-type NMOS transistor connects with the earthing line 221, and the joint A 161 between the depression-type transistor 401 and the enhancement-type transistor 402 is used as an output terminal.

[0004]—Existing example (Fabrication method)—

In general, an existing voltage detector and a voltage regulator comprising a CMOS transistor respectively are fabricated differently from each other by forming a high resistance and a gate electrode with a polysilicon film and changing the amount of impurities to be introduced into the polysilicon film.

An existing method for fabricating high-resistance polysilicon and a polysilicon-gate CMOS transistor on the same substrate is described below by taking a P substrate as an example and referring to FIGS. 20 to 22.

An N well 2 is first formed on a P-type silicon substrate 1 through ion implantation and thermal diffusion and thereafter, a P-type region 3 and an N-type region 4 are formed through ion implantation to separate devices. Then, a field oxide film 5 and a gate oxide film 6 are formed {FIG. 21A}, ions are implanted into a channel region for transistor threshold control {FIG. 2B} and a polysilicon film 7 is deposited {FIG. 21C}. Then, ions are implanted into high-resistance polysilicon 8 to control the resistance value {FIG. 21D}, a CVD oxide film 9 wider than a portion serving as the high-resistance polysilicon 8 is deposited, the pre-deposition of phosphorus is performed, and high-concentration phosphorus is diffused in the polysilicon film {FIG. 21E}. Then, the oxide film is removed from the polysilicon and thereafter the high-resistance polysilicon 8 is formed through etching {FIG. 21F}. Polysilicon gate electrodes 10 and 11 are then formed through etching by using another mask {FIG.22A}, and finally ions are implanted into an N-channel-side source and drain region 12 and a p-channel-side source and drain region 13 {FIG. 22B} and provided with thermal annealing to complete the high-resistance polysilicon 8 and the polysilicon-gate CMOS transistor {FIG. 22C}.

For an existing semiconductor device, the gate electrodes of PMOS and NMOS transistors are the N type. Therefore, the PMOS transistor is necessarily of the buried channel type. A buried-channel-type MOS transistor has disadvantages of inferior channel leak current characteristics, more leak current than the surface channel type, short-channel effect and the disadvantage that it is difficult to control the threshold voltage. Particularly, the necessity for low power consumption under operation is larger than the case of a general IC because a voltage detector and voltage regulator continuously operate. Moreover, because energy is supplied to the buried-channel-type MOS transistor from a battery, low-voltage operation is necessary. Therefore, it is necessary to lower the threshold voltage of the MOS transistor to operate a semiconductor device at a low voltage. However, because the existing buried-channel-type MOS transistor has a large channel leak current, low-voltage operations are difficult to realize. Moreover, because channel leak current tends to increase at a high temperature, low-voltage operations are more difficult than those at the room temperature.

Furthermore, it is necessary to lower the reference voltage from the reference voltage circuits 301 and 311 in order to operate the semiconductor device at a low voltage. In the case of the existing reference voltage circuits 301 and 311, the reference voltage to be outputted is determined by the sum of the threshold voltage of the enhancement-type MOS transistor 401 and that of the depression-type MOS transistor of the circuits. Therefore, the threshold voltage must be lowered to obtain a low reference voltage. However, lowering the reference voltage is limited due to the above channel leak current.

Furthermore, the existing method for fabricating a semiconductor device comprising high-resistance polysilicon and a polysilicon-gate CMOS transistor has the following problems. That is, though introduction of impurities into the polysilicon gate 8 is accomplished by ion implantation, introduction of impurities into the polysilicon gates 10 and 11 is accomplished by the diffusion implantation method called pre-deposition. Therefore, to perform the pre-deposition of phosphorus, high-concentration phosphorus must be prevented from entering a high-resistance region by covering the high-resistance region with a CVD oxide film. Moreover, because the etching rate differs due to the phosphorus concentration, it is impossible to etch both the high resistance polysilicon 8 and the polysilicon gates 10 and 11 at the same time. Therefore, a problem occurs that the number of processes increases.

Furthermore, as a method for solving the above problem, boron ions are implanted into the gate electrode of a PMOS transistor when the gate electrode of an NMOS transistor uses an N-type gate electrode and the gate electrode of the PMOS transistor uses a P-type gate electrode. However, there are problems that boron ions penetrate into a channel region due to implantation of the ions into the gate electrode, the boron ions implanted into the gate electrode penetrate into the channel region, or the gate electrode is depleted due to insufficient thermals anneal. Moreover, to keep the thermal annealing temperature low, it is necessary to increase the phosphorus concentration of the inter-layer insulating film PSG 20. When increasing the phosphorus concentration, however, a problem occurs that the phosphorus in the inter-layer insulating,film PSG 20 diffuse in the high-resistance polysilicon 8 to decrease the resistance value of the high-resistance polysilicon 8.

The present invention is made to solve the above problems and its first object is to provide a voltage detector and a voltage regulator which operate at a low voltage and a low current consumption.

It is the second object of the present invention to lower the output reference voltage of a reference voltage circuit used for a voltage detector and a voltage regulator.

It is the third object of the present invention to provide a method for efficiently fabricating a semiconductor device when forming a high-resistance polysilicon gate and a CMOS transistor on the same substrate.

It is the fourth object of the present invention to provide a semiconductor device fabrication method for preventing boron from penetrating into a channel region when forming a P-type polysilicon gate through ion implantation and a polysilicon gate from being depleted when forming polysilicon gate through ion implantation.

It is the fifth object of the present invention to provide a semiconductor device fabrication method for preventing the resistance value change of high-resistance polysilicon due to diffusion of phosphorus in an inter-layer insulating film PSG.

SUMMARY OF THE INVENTION

The present invention uses the following means in order to achieve the above objects.

First means is to use a semiconductor integrated circuit device comprising a PMOS transistor, an NMOS transistor, and a resistance, in which the gate electrode of the PMOS transistor uses the P-type low-resistance polysilicon 11, the gate electrode of the NMOS transistor uses the N-type low-resistance polysilicon 10, and the resistance uses the high-resistance polysilicon 8.

Second means is to use a semiconductor integrated circuit device having the reference voltage circuits 301 and 311 comprising the depression-type NMOS transistor 401 and the enhancement-type NMOS transistor 402, in which the gate electrode of the depression-type NMOS transistor is connected with the earthing line 221 and the gate electrode of the enhancement-type NMOS transistor 402 is connected to the joint A 151 between the source of the depression-type NMOS transistor 401 and the drain of the enhancement-type NMOS transistor 402.

Third means is to provide the gate oxide films of a PMOS transistor and an NMOS transistor with a thickness of 20 to 100 nm, the polysilicon gate electrodes 10 and 11 and the high-resistance polysilicon 8 with a thickness of 300 to 400 nm, the source/drain region of the PMOS transistor with an acceptor concentration of 0.5 to $1.5 \times 10^{26}$ /m$^3$, and the source/drain region of the NMOS transistor with a donor concentration of 2.1 to $3.0 \times 10^{26}$ /m$^3$.

Fourth means is to use the insulating film of a CMOS transistor and the insulating film of a PMOS transistor which is a film comprising a three-layer structure in which the gate oxide film 6, a silicon nitride film 17, and top oxide film 18 are arranged in order toward the gate electrode 11 from the surface of a substrate, and use the gate oxide film 6 as the insulating film of an NMOS transistor.

Fifth means is to flatly deposit an NSG film 19 at the opposite side to the silicon substrate 1 so as to contact the high-resistance polysilicon 8 and flatly deposit the PSG film 20 at the opposite side to the high-resistance polysilicon 8 so as to contact the NSG film 19.

Sixth means is to simultaneously form a resistor having a controlled resistance value (hereinafter sometimes referred to as simply "resistance", a wire, and a gate electrode after the photolithography process by using resist as a mask before introducing impurities into a polysilicon film, introduce impurities for resistance value control into polysilicon serving as a resistance through ion implantation to form the high-resistance polysilicon 8, introduce impurities into polysilicon serving as a wire through ion implantation to form low-resistance polysilicon, introduce impurities serving as acceptors into polysilicon serving as the gate electrode 11 of a PMOS transistor and the source/drain region of the PMOS transistor through ion implantation, and introduce impurities serving as donors into the polysilicon 10 serving as the gate electrode of an NMOS transistor and the source/drain region of the NMOS transistor through ion implantation.

Seventh means is to set the thickness of the polysilicon gate films 10 and 11 in the sixth means to 300 to 400 nm and the boron ion implantation energy to the gate electrode 11 to 20 to 35 KeV.

Eighth means is to set the thickness of the polysilicon gate films 19 and 11 in the sixth means to 300 to 400 nm and the BF$_2$ ion implantation energy to the gate electrode 11 to 50 to 100 KeV.

Ninth means is to form a gate electrode through etching when the thickness of the gate oxide film in the sixth means is 40 nm or more, thereafter completely remove the oxide film from source and drain regions through etching and then form an oxide film up to a thickness of 20 nm through thermal oxidation, and set boron and BF$_2$ ion implantation energies for the gate electrode 11 (to the source and drain regions) to 20 to 35 KeV and 50 to 100 KeV respectively.

Tenth means is to set the thickness of the gate oxide film 6 of the CMOS transistor in the sixth means to 20 to 100 nm and moreover set every thermal annealing temperature after forming a source and a drain to 800° to 900° C.

Eleventh means is to introduce impurities into the polysilicon gate electrodes 10 and 11 and thereafter activate the impurities in silicon through RTA (Rapid Thermal Annealing).

The following functions are obtained by using the above means.

By using the first means, it is possible to change a PMOS transistor of a CMOS transistor from the buried channel type to the surface channel type. By changing the PMOS transistor to the surface channel type, the channel leak current characteristic ( subthreshold characteristic ) and the short channel effect are improved and a threshold voltage can more easily be controlled.

Moreover, by constituting a voltage detector and a voltage regulator by using the above CMOS transistor, it is possible to operate the voltage detector and voltage regulator at an operating voltage of even 0.35 V and thereby lower the voltage. Furthermore, it is possible to keep the deviation of a detected voltage 3003 at 2 mV/° C or less in the case of the voltage detector and the fluctuation of an output voltage at 1% in the case of the voltage regulator in a temperature range of –40° C. to 80° C. even in the temperature characteristic.

For an existing reference voltage circuit, the reference voltage to be outputted is determined by the sum of the enhancement-type MOS transistor 402 threshold voltage and the depression-type MOS transistor 401 threshold voltage in the circuit. However, by using the second means, the reference voltage to be outputted comes to half the sum of the enhancement-type MOS transistor 402 and the depression-type MOS transistor 401 in the circuit and thereby the reference voltage can be lowered. Moreover, by using the CMOS transistor in the first means for the reference voltage circuits 301 and 311, the lower limit of the reference voltage is lowered to 0.3 V though the existing lower limit of it is 0.7 V.

When using the third means, boron is prevented from penetrating in a channel region, and the source/drain contact resistance can be decreased and the break down voltage of a MOS transistor is improved by limiting the acceptor concentration and the donor concentration of the source/drain region of the MOS transistor.

Because the range of boron ions in the silicon nitride film 17 is approx. 0.8 times the range of boron ions in a silicon oxide film, it is possible to prevent boron from penetrating for the same gate electrode film thickness and insulating film thickness by using the fourth means. Moreover, because boron hardly diffuses into the silicon nitride film 17, it is possible to prevent boron from penetrating into the channel region of a gate electrode due to thermal diffusion. Furthermore, because the relative dielectric constant of a silicon nitride film is 7.5 which is approx. 2 times larger than that of a silicon oxide film, higher conductance can be obtained by containing a silicon nitride film for the same insulating film thickness, and a CMOS transistor with a high current output can be obtained.

When using the fifth means, the phosphorus in the interlayer insulating film PSG 20 diffuses in the high-resistance polysilicon 8 by increasing the phosphorus concentration of the inter-layer insulating film PSG 20, and thereby the problem that the resistance value of the high-resistance polysilicon 8 is decreased is solved, and the fluctuation of the resistance value of the high-resistance polysilicon 8 due to thermal annealing can be prevented.

By using the sixth means, a method for efficiently fabricating a semiconductor device comprising high-resistance polysilicon 8 and a polysilicon gate CMOS transistor can be obtained and moreover the semiconductor device can be fabricated at a low cost.

By using the seventh and eighth means, it is possible to prevent boron from penetrating in a channel region because all the boron ions implanted into the gate electrode 11 stop in the gate electrode.

By using the ninth means, it is possible to decrease the ion implantation energy to a source and a drain. Therefore, the present invention enables ion implantation in an energy range in which boron penetration does not occur because an ion implantation energy can be set independently of the thickness of the gate oxide film 6 when the introduction of impurities into the gate electrodes 10 and 11 and the introduction of impurities into a source and a drain are performed by the same ion implantation.

By using the tenth means, it is possible to prevent the boron in the gate electrode 11 from penetrating into the channel region due to thermal diffusion. Moreover, since impurities in silicon are activated, it is possible to decrease the resistance values of source/drain region and the polysilicon gate electrode 10 and 11.

BRIEF DESCRIPTION OF THE DRAWINGS

FIG. 1 is a block diagram showing the process of the method for fabricating the sixth embodiment of the present invention;

FIGS. 2A to 2F are sectional views showing the process of the method for fabricating the sixth embodiment of the present invention;

FIG. 3 is a block diagram showing the circuit of the voltage detector in the first embodiment;

FIG. 4 is an illustration showing the comparison between the output voltage of the voltage detector of the first embodiment and that of an existing voltage detector;

FIG. 5 is an illustration showing the relationship between the minimum operating voltage according to the voltage detector of the first embodiment and the temperature;

FIG. 6 is a block diagram showing the circuit of the voltage regulator in the second embodiment;

FIG. 7 is a block diagram showing the reference voltage circuit in the third embodiment;

FIG. 8 is a structural sectional view of the semiconductor device in the fourth embodiment;

FIG. 9 is a structural sectional view of the semiconductor device in the fifth embodiment;

FIG. 10 is an illustration showing the comparison between the buried channel type and the surface channel type, and showing the relationship of a PMOS transistor fabricated by the sixth embodiment method between channel leak current and threshold voltage;

FIG. 11 is an illustration showing the relationship between polysilicon gate film thickness and penetration density of boron into a channel region in the case of boron ion implantation used in the sixth embodiment method;

FIG. 12 is an illustration showing the relationship between polysilicon gate film thickness and penetration density of boron into a channel region in the case of $BF_2$ ion implantation used in the sixth embodiment method;

FIG. 13 is an illustration showing the relationship between boron ion implantation energy and penetration density of boron into a channel region, according to the sixth embodiment method;

FIG. 14 is an illustration showing the relationship between $BF_2$ ion implantation energy and penetration density of boron into a channel region, according to the sixth embodiment method;

FIG. 15 is an illustration showing the relationship between gate oxide film thickness and penetration density of boron (due to thermal diffusion) into a channel region, according to the sixth embodiment method;

FIG. 16 is an illustration showing the relationship between thermal annealing temperature after forming a source and a drain and penetration density of boron (due to thermal diffusion) into a channel region, according to the sixth embodiment method;

FIG. 17 is an illustration showing the comparison between penetration density of boron (due to thermal diffusion) into a channel region and anneal temperature in the sixth embodiment method when a silicon nitride film is deposited on a gate oxide film or not;

FIGS. 18A to 18F are sectional views of the process in a seventh embodiment method;

FIGS. 19A and 19B are sectional views of the process in the seventh embodiment method;

FIG. 20 is a block diagram of the process in an existing semiconductor device fabrication method;

FIGS. 21A to 21F are sectional views of the process in an existing semiconductor device fabrication method;

FIGS. 22A to 22C are sectional views of the process in an existing semiconductor device fabrication method;

FIG. 23 is a diagram of the reference voltage circuit in an existing semiconductor device circuit;

FIG. 24 is an illustration showing the relationship between reflow temperature and breakdown voltage according to the donor density of the NMOS transistor;

FIG. 25 is an illustration showing the relationship between the gate capacity and gate voltage; and FIG. 26 is an illustration showing the relationship between the depleting rate and the reflow temperature,.

DETAILED DESCRIPTION OF THE PREFERRED EMBODIMENTS (Embodiment 1)

A voltage detector which is the first embodiment of the semiconductor device of the present invention is described below by referring to FIG. 3.

In the present invention, each circuit of the voltage detector uses an N-type gate electrode for the NMOS transistor and a P-type gate electrode for the PMOS transistor, and the voltage detector comprises the reference voltage circuit 301, voltage division circuit 302, voltage comparison circuit 303, and output circuit 304.

The reference voltage circuit 301 comprises a depletion- or depression-type NMOS transistor and an enhancement-type NMOS transistor which mutually connect in series between the power supply line 202 and the earthing line 201, and at the both sides of the joint A 111 it is connected a source of depression-type transistor with a drain of enhancement-type transistor and it has a function of outputting a constant output voltage to the joint A 111.

The voltage division circuit 302 comprises a plurality of resistances connected between the power supply line 202 and the earthing line 201 and has a function of dividing a power supply voltage by using the joint B 112 as a separating point.

The voltage comparison circuit 303 comprises PMOS transistors and NMOS transistors, which are connected between the power supply line 202 and the earthing line 201, and connects with the reference voltage circuit 301 at the joint A 111 and with the voltage division circuit 302 at the joint B 112, and compares the voltage difference between the joint A 111 and the joint B 112 and has a function of outputting a voltage equal to a power supply voltage to the joint C 113 when the voltage at the joint B 112 is lower than the voltage at the joint A 111.

The output circuit 304 comprises an inverter constituted by combining a PMOS transistor with an NMOS transistor, in which the source of the PMOS transistor connects with the power supply line 202, the drain of the PMOS transistor connects with the drain of the NMOS transistor, and the source of the NMOS transistor connects with the earthing line 201.

The voltage comparison circuit 303 and the gate electrode of the inverter are connected to each other at the joint C 113, the gate electrodes of the PMOS and NMOS transistors receive the output of the voltage comparison circuit 303, and the joint connected the drain of each transistor is connected to the output terminal 103.

The voltage detector outputs a voltage applied to the power supply terminal 102 when the voltage applied to the power supply terminal 102 is higher than a preset detection voltage, and outputs the voltage of the earthing terminal 101 when the voltage applied to the power supply terminal 102 is lower than the detection voltage. FIG. 4 is a graph showing the output voltage of a voltage detector to the power supply voltage, in which symbol 3001 represents the output voltage of an existing voltage detector and symbol 3002 represents the output voltage of the voltage detector of the present invention. A desired detection voltage can be obtained by a polysilicon fuse built in the voltage division circuit 302. The minimum operating voltage of a voltage detector is set to a voltage when a voltage detector cannot output the voltage of the earthing terminal 101. This is because, when the voltage applied to the power supply terminal 102 lowers, the reference voltage circuit 301, voltage comparison circuit 303, and output circuit 304 cannot operate. As shown in FIG. 4, though the minimum operating voltage 3004 of the existing voltage detector is 0.4 V at the room temperature, the minimum operating voltage 3005 of the voltage detector of the present invention is 0.25 V under the same condition. This shows that each circuit operates even if the voltage applied to the supply terminal 102 is low, because in each circuit the gate electrode of the NMOS transistor comprises an N-type gate electrode and the gate electrode of the PMOS transistor comprises a P-type gate electrode.

Moreover, at high temperature the operation of the existing voltage detector is indeterminate because the threshold voltage of the PMOS transistor lowers and channel-leak current increases. FIG. 5 shows a relationship between the minimum operating voltage and temperature according to the present invention. In the case of the voltage detector of the present invention, however, the operation is stable even in a temperature range of –40° C. to 80° C. and the error of a detected voltage only ranges between 0.05 and 0.2 mV/° C. Also, the minimum operating voltage only ranges between 0.18 and 0.32 V in the temperature range of –40° C. to 80° C. Therefore, the voltage detector of the present invention operates at 0.35 V or higher in the temperature range of –40° C. to 80° C. Moreover, for a voltage detector, the voltage applied to the power supply terminal 102 is not constant but it ranges between 0 and several volts. Therefore, the breakdown voltage of a voltage detector requires several volts or more. Thus, because the breakdown voltage of the NMOS transistor and the PMOS transistor in the present invention ranges between 11 and 13 V in the temperature range of –40° C. to 80° C., the voltage detector of the present invention operates at a voltage between 0.35 and 10 V (both included) by considering that IC operations are assured in the temperature range of –40° C. to 80° C.

Moreover, as another embodiment, it is possible to constitute a voltage regulator so that each circuit of the regulator uses an N-type gate electrode for the NMOS transistor and a P-type gate electrode for the PMOS transistor. FIG. 6 shows a block diagram of a voltage regulator. The voltage regulator comprises the reference voltage circuit 311, voltage division circuit 312, voltage comparison circuit 313, and output circuit 314.

The reference voltage circuit 311 comprises a depression-type NMOS transistor and an enhancement-type NMOS transistor which mutually connect in series between the power supply line 212 and the earthing line 201, and at the both sides of the joint A 121 it is connected a source of depression-type transistor with a drain of enhancement-type transistor and it has a function of outputting a constant output voltage to the joint A 121.

The voltage division circuit 312 comprises a plurality of series resistances connected between the power supply line 212 and the earthing line 211 and has a function of dividing a power supply voltage by using a joint B 122 as a separating point.

The voltage comparison circuit 313 comprises PMOS transistors and NMOS transistors, which are connected between the power supply line 212 and the earthing line 211, and connects with the reference voltage circuit 311 at the joint A 121 and with the voltage division circuit 312 at the joint B 122, and compares the voltage difference between the joint A 121 and the joint B 122 and has a function of outputting the gate controlled voltage to the output circuit 314.

The output circuit 314 comprises a PMOS transistor or an NMOS transistor. When the circuit 314 comprises the PMOS transistor, it is constituted so as to connect the source of the PMOS with the power supply line 212 and the drain of the PMOS with a voltage division circuit 312. When the circuit 314 comprises the NMOS transistor, it is constituted so as to connect the drain of the NMOS with the power supply line 212 and the source of the NMOS transistor with the voltage division circuit 312.

Moreover, the circuit 314 is constituted so as to connect the voltage comparison circuit 313 with the gate electrode of the PMOS or NMOS transistor at the joint C 123 and receive the output of the voltage comparison circuit 313 by the gate electrode of the PMOS or NMOS transistor, and has a function of outputting a voltage to an output terminal 113 connected to the drain of the PMOS transistor or the source of the NMOS transistor.

The voltage regulator has a function of continuously outputting constant output voltage even if the voltage of the power supply terminal 112 or a load connected to the output terminal 113 fluctuates. The voltage of the output terminal 113 is divided in the voltage division circuit 312. The comparison circuit 313 compares the divided voltage with the reference voltage outputted from the reference voltage circuit 311, and it outputs the gate controlled voltage. The gate controlled voltage keeps the voltage of the output terminal 113 constant by controlling the gate voltage of a MOS transistor. Because the voltage regulator of the present invention enables the threshold voltage of the MOS transistor in each circuit to lower, low-voltage operations are realized and the operating voltage ranges between 0.35 and 10 V in the temperature range of –40° C. to 80° C.

(Embodiment 2)

The second embodiment of the semiconductor device is described below.

To operate the semiconductor device at a low voltage, it is also necessary to lower the reference voltage that is outputted by a reference voltage circuit. In the case of an existing reference voltage circuit, the reference voltage is determined by the sum of the threshold voltage of an enhancement-type MOS transistor of the circuit and that of a depression-type MOS transistor of the circuit. Therefore, to lower the reference voltage, a threshold voltage must be lowered. However, when the threshold voltage is lowered, off-leak current increase and other circuits do not operate normaly. Therefore, lowering the reference voltage by decreasing the threshold voltage is limited. In the case of the present invention, however, the reference voltage circuit is constituted as shown in FIG. 7. For the depression-type NMOS transistor 401, the gate is connected with the earthing line 221 and equalize the potential of the substrate with that of the source and the source is connected with the drain of the enhancement-type NMOS transistor 402. For the enhancement-type NMOS transistor 402, the gate is connected with the drain and equalize the potential of the substrate with that of the source. The drain of the depression-type NMOS transistor 401 is connected with the power supply line 222 and the source of the enhancement-type NMOS transistor 402 is connected with the earthing line 221. The joint A 151 between the depression-type NMOS transistor 401 and the enhancement-type NMOS transistor 402 is an output terminal of the reference voltage circuit. As an additional embodiment, it is also possible to connect a resistance between the gate of the depression-type NMOS transistor 401 and the earthing line 221 or between the drain of the depression-type NMOS transistor 401 and the power supply line 222.

In the case of this present invention, it is desirable to set the threshold voltage $V_{TND}$ of the depression-type NMOS transistor 401 on −0.2 to −0.4 V and the threshold voltage $V_{TN}$ of the enhancement-type NMOS transistor 402 on 0.2 to 0.3 V. Furthermore, it is most desirable to set $V_{TND}$ to −0.3 V and $V_{TN}$ to 0.2 V. By using the above constitute, it makes possible to operate the voltage detector and voltage regulator at a low voltage, because the reference voltage is half of the existing reference voltage even when using the MOS transistors with the same size and the same threshold voltage as the existing reference voltage circuit shown in FIG. 23.

(Embodiment 3)

At third embodiment of the semiconductor device is described below. For the semiconductor device of the present invention, the gate electrode of the NMOS transistors are N-type and the gate electrode of the PMOS transistors are P-type. However, if a gate oxide film is thinner than 20 nm, ions may penetrate the film to reach a channel region due to ion implantation and thermal annealing. Moreover, to assure insulation of an oxide film for 10 years, an electric field applied to the oxide film must be set to 3 MV/cm or less. Therefore, the gate oxide film thickness of MOS transistors constituting a semiconductor device having a wide operating voltage, such as a voltage detector or voltage regulator, must be determined on those conditions.

Therefore, for the present invention, the gate oxide film thickness is set to 20 nm or more. However, if the gate oxide film is thicker than 100 nm, it is impossible to decrease the threshold voltage less than 1.0 V, without against type channel dope. To use against type channel dope is no use for making P-type gate on the PMOS transistor, because it makes a buried channel. Therefore, the gate oxide film thickness of the semiconductor device of the present invention is set from 20 to 100 nm.

Furthermore, if too many boron ions are implanted into the polysilicon gate, ions may penetrate the gate and the gate oxide to reach a channel region. Therefore, for the present invention, the number of boron ions to be implanted in PMOS transistor is set to $1.5 \times 10^{26}$ /cm$^3$ or less. But, decreasing of the concentration of ions implanted into the source/drain region, to less than $0.5 \times 10^{26}$ /cm$^3$ makes high increasing of the source/drain resistance, that causes but effect at the integrated circuit. Therefore, for the semiconductor device of the present invention, the acceptor concentration of the source/drain region of the PMOS transistor is set to 0.5 to $1.5 \times 10^{26}$ /cm$^3$. Moreover, for an NMOS transistor, if few ions are implanted, the drain breakdown voltage may lower due to defects which are caused when activating impurities through thermal annealing. FIG. 24 shows a graph of the yield of NMOS transistors drain breakdown voltage to the reflow temperature, when setting the donor concentration of the source/drain region to $1.5 \times 10^{26}$ /m$^3$ 4001 and $2.1 \times 10^{26}$ /m$^3$ 4002. From the graph, it is found that the donor concentration of the source/drain region of the NMOS transistor should be set to $2.1 \times 10^{26}$ /m$^3$ or more in order to keep the high yield. But, it is difficult to make the concentration more than $3.0 \times 10^{26}$ /cm$^3$ by the present use of ion implantation method. Therefore, for the semiconductor device of the present invention, the donor concentration of the source/drain region of the NMOS transistor is set to 2.0 to $3.0 \times 10^{26}$ /m$^3$.

(Embodiment 4)

The fourth embodiment of the semiconductor device is described below.

In the case of a semiconductor device comprising PMOS transistors and NMOS transistors, in which the gate electrode of the PMOS transistors is made of P-type polysilicon containing boron and the gate electrode of the NMOS transistors is made of N-type polysilicon containing phosphorus or arsenic, there is a problem that boron ions implanted into the polysilicon gate electrode of the PMOS transistor penetrate into the channel region due to the thermal annealing. That changes the threshold voltage of the PMOS transistors. FIG. 8 shows a structural sectional view of the fourth embodiment of the inventive semiconductor device. In the case of the present invention, however, boron cannot penetrate into the channel region by the silicon nitride film 17. Therefore, the threshold voltage of PMOS transistors will not change under the structure that the insulating film is constituted by a three-layer film which consists of gate oxide film 6, silicon nitride film 17, and top oxide film 18, arranged in order from the substrate surface toward the P-channel polysilicon gate electrode 11. When the insulating film of the NMOS transistor is as same as PMOS transistor, NMOS transistors have a problem that hot carriers are trapped at the interface between the silicon nitride film 17 and the gate oxide film 6 to change the threshold voltage. Therefore, in the present invention, the insulating film of PMOS transistors consists of the gate oxide film 6, silicon nitride film 17, and top oxide film 18. And, the insulating film of NMOS transistors consists of the gate oxide film 6.

(Embodiment 5)

The fifth embodiment of the semiconductor device is described below by referring to FIG. 9.

There is a method for lowering a thermal annealing temperature as the method for preventing boron in the polysilicon gate electrode of PMOS transistors from penetrating into the channel regions. In this case, the phosphorus concentration of the inter-layer insulating film PSG (Phosphosilicate Glass) 20 must be increased to secure the coverage. However, when increasing the phosphorus concentration, a problem occurs that the phosphorus in the inter-layer insulating film PSG 20 diffuses in the high-resistance polysilicon 8 to decrease the resistance value of the high-resistance polysilicon 8. However, the present invention makes it possible to prevent phosphorus diffusing into the high-resistance polysilicon 8 from the PSG 20 by forming the NSG (Nondoped Silicate Glass) 19 contacting the high-resistance polysilicon 8 and flatly deposited at the opposite side to the silicon substrate 1 and the PSG 20 contacting the NSG 19 and flatly deposited at the opposite side to the high-resistance polysilicon 8.

(Embodiment 6)

Gate oxide film 200A

The embodiment of the present invention is described below by referring to the accompanying drawings. FIG. 1 is a block diagram of the process of the sixth embodiment of the semiconductor device of the present invention. FIGS. 2A to 2F are sectional views of the process of the sixth embodiment of the semiconductor device of the present invention.

First, an N well 2 is formed in a P-type (20 to 30 Ωcm) silicon substrate 1 through ion implantation (phosphorus: 100 to 150 KeV, 3 to 4 E12/cm$^2$) and thermal diffusion (in a 1175° C. oxidation atmosphere for 19 hr) and thereafter the P-type region 3 and N-type region 4 for device separation are formed through ion implantation (P-type region: Ion implanting conditions Boron 25 to 35 KeV 5.0 to 8.0 E13/cm$^2$, N-type region: Ion implanting conditions Phosphorus 60 to 120 KeV 1.0 to 2.0 E12/cm$^2$). Then, a field oxide film 5 (approx. 1 µm) and a gate oxide film 6 (approx. 20 nm) are formed through thermal oxidation {FIG. 2A} and ion implantation (N-channel enhancement-type boron 25 to 40 KeV 1 to 4 E11/cm$^2$, N-channel depression-type phosphorus 40 to 100 KeV 2 to 6 E11/cm$^2$, P-channel enhancement-type phosphorus 40 to 100 KeV 1 to 4 E11/cm$^2$) to a channel region for transistor threshold voltage control is performed {FIG. 2B}. A polysilicon film 7 (300 to 400 nm) is then deposited. {FIG. 2C}.

Then, a high-resistance polysilicon 8 and polysilicon gate electrodes 10 and 11 are simultaneously formed through etching {FIG. 2D}.

Then, ion implantation (phosphorus 40 to 60 KeV 2 to 8 E14/cm$^2$) for control of the resistance of high-resistance polysilicon 8 and ion implantation (N-channel side phosphorus 40 to 80 KeV 7.0 to 10.0 E15/cm$^2$, P-channel side boron 20 to 35 KeV 2.0 to 5.0 E15/cm$^2$) for introduction of impurities into a gate electrode and formation of source and drain regions at the N-channel side (polysilicon gate electrode 10 and source/drain region 12) and the P-channel side (polysilicon gate electrode 11 and source/drain region 13) are performed {FIG. 2E}. In this case, ions are also implanted into wiring polysilicon.

Then, NSG (Nondoped Silicate Glass) is deposited up to a thickness of 200 to 300 nm and moreover a PSG (Phosphosilicate Glass) film containing 8 to 12 wt% of phosphorus is deposited up to a thickness of 400 to 600 nm to perform the reflow of an inter-layer insulating film at a temperature of 800° to 900° C. for approx. 30 min.

Finally, contact holes and metallic electrodes are formed to obtain the circuit, comprising high-resistance polysilicons and surface-channel-type polysilicon gate CMOS transistors {FIG. 2F}.

A main feature of this embodiment lies in the fact that impurities are also introduced into the polysilicon gate electrodes through implantation of ions into source and drain regions by using an ion implantation technique for fabricating a semiconductor device comprising high-resistance polysilicons and polysilicon gate CMOS transistors.

When using phosphorus pre-deposition for introduction of impurities into polysilicon gate electrodes according to the existing method, it is necessary to form and remove a mask oxide and etch polysilicons one by one with different phosphorus concentrations. In the case of the present invention, however, one-time etching is enough because polysilicon is formed through etching under a non-doped state and moreover pre-deposition of phosphorus is unnecessary because introduction of impurities into polysilicon gate electrodes are performed through implantation of ions into source and drain region.

Moreover, the existing method cannot lower the threshold voltage of PMOS transistors. Because the PMOS transistors made by the existing method are of the buried-channel-type, therefore the off characteristic is inferior than that of the surface-channel-type (off-leak current strongly increase), the present invention improves the off characteristic at lower threshold voltage because PMOS transistors become the surface channel type similarly to NMOS.

FIG. 10 is an illustration showing the characteristic of the semiconductor device of an embodiment of the present invention, that is, which shows the relation between threshold voltage and PMOS channel leak current. From FIG. 10, it is found that the surface channel type has smaller leak current and a much better off characteristic than the buried-channel-type.

The PMOS of the present invention is of the surface channel type as same as the NMOS is. Therefore, PMOS transistors have small leak current even for low threshold voltage which results in a lower operating voltage.

And the present invention is also useful for decreasing of the production costs of the semiconductor devices.

For example, when a voltage detector which is one of the semiconductor devices are produced by the existing fabrication method, approx. 20 masks and 300 processes are required. However, when the same devices are produced by the fabrication method of the present invention, 2 masks and 30 processes can be saved.

FIG. 4 shows the comparison between the characteristic of the semiconductor device (voltage detector) of the present invention and that of an existing semiconductor device (voltage detector). In FIG. 4, X axis shows power supply voltage and Y axis shows output voltage.

A voltage detector has a function of output equal to a power supply voltage when the power supply voltage becomes equal to or higher than a detection voltage (3003) (0.8 V in FIG. 4). FIG. 4 shows the comparison of the output voltage curve (3001) of the voltage detector fabricated by the existing fabrication method and the output voltage curve (3002) of the voltage detector fabricated by the fabrication method of the present invention in the same graph.

When the power supply voltage is very small, the voltage detectors of the existing method and the present invention output equal to the power supply voltage because their internal circuits cannot be operated. However, the voltage detector fabricated by the fabrication method of the present invention starts the operation at low voltage and the minimum operating voltage is approx. 0.25 V (3005). However, the minimum operating voltage of the voltage detector fabricated by the existing fabrication method is approx. 0.4 V (3004).

FIGS. 11 to 14 are illustrations showing the characteristics of the semiconductor device of the present invention. FIGS. 11 and 12 are graphs in which X axis shows polysilicon concentration and Y axis shows channel surface boron concentration immediately after implantation of B$^+$ and BF$_2^+$ respectively. FIGS. 13 and 14 are graphs in which X axis shows B$^+$ and BF$_2^+$ ion implantation energies respectively and Y axis shows channel surface boron concentration immediately after ion implantation.

Because boron has a small atomic weight, boron ions are easily implanted deeply. From FIGS. 11 to 14, it is found that boron may reach up to a channel region (penetration of boron into channel region) when the polysilicon film thickness is thin or the ion implantation energy is high. The present invention prevents the penetration of boron into the channel region by limiting the polysilicon gate film thickness to 300 nm or more and boron and $BF_2$ ion implantation energies to 35 KeV or less and 100 KeV or less respectively.

The lower limit of the polysilicon film thickness is determined by penetration of boron into the channel region. However, the upper limit of the polysilicon film thickness is set to 400 nm in order to escape the depletion of the gate electrode and the decreasing the sheet resistivity of high-resistance polysilicon. Though it is possible to use a polysilicon film with a thickness of 400 nm or more, the polysilicon film thickness of 300 to 400 nm is proper as a use level.

Also, the upper limits of $B^+$ and $BF_2^+$ ion implantation energies are determined by penetration of boron into a channel region as described above. However, very low implantation energy is not better. Unless impurities are sufficiently introduced into a source and drain or a gate electrode, a parasitic resistance increases or, in the worst case, no operation may be performed. Therefore, the lower limits of $B^+$ and $BF_2^+$ ion implantation energies are set to 20 KeV and 50 KeV respectively by selecting a condition in which 60 to 80% of implanted impurities are introduced into source and drain surfaces eyed if an oxide film with a thickness of approx. 20 nm is present on the surfaces.

FIG. 15 is a graph in which X axis shows gate oxide film thickness and Y axis shows channel surface boron concentration after thermal annealing. FIG. 16 is a graph in which X axis shows reflow temperature of an inter-layer insulating film and Y axis shows channel surface boron temperature after thermal annealing. From FIGS. 15 and 16, it is found that high-concentration boron in a gate electrode may pass through an oxide film and diffuse in a channel region (penetration of boron into channel region). Therefore, the present invention prevents the penetration of boron into a channel region due to thermal annealing by limiting the gate oxide film thickness to 20 nm or more and the thermal annealing temperature after forming source and drain regions to 900° C. or lower.

The upper limit of reflow temperature is set to a value in which penetration of boron into a channel region does not occur as described above. However, the lower limit of reflow temperature is set to a value in which depletion of a gate electrode does not occur. The depletion of a gate electrode is a phenomenon in which a depletion layer is formed when the impurity concentration in the gate electrode is low. Depleting of a gate electrode deteriorates the on-characteristic (changing a lot of drain current) of a MOS transistor and affects operations of a semiconductor device. In general, impurities introduced into polysilicon through ion implantation uniformly diffuse in a gate electrode through thermal annealing after introduction. However, because diffusion is not adequately performed when the reflow temperature is low, the impurity concentration in the gate electrode is not uniform and the impurity concentration near a channel is kept low. Therefore, the gate electrode is depleted. In this case, to measure how a gate electrode is depleted, there is a method of measuring the gate capacity-voltage characteristic. FIG. 25 shows the gate capacity-voltage characteristic. When comparing the maximum capacity value Cmax 5001 with the gate capacity at maximum power supply voltage value Cvdd 5002 in this graph, it can be said that the gate electrode is depleted less as the ratio between them approaches 1. FIG. 26 shows a graph of Cmax/Cvdd to reflow temperature. According to the graph, the lower limit of the reflow temperature in which a gate electrode is not depleted is determined as 800° C.

The fabrication method of the present invention limits the reflow temperature to 900° C. or lower in order to prevent the penetration of boron into a channel region. In this case, the coverage of an inter-layer insulating film set between polysilicon and a metallic electrode is deteriorated. Then it may happen that problems of deterioration of the reliability of wires such electromigration will occur. Therefore, for the present invention, a PSG (Phosphosilicate Glass) film is selected as an inter-layer insulating film which contains high-concentration (8 to 12 wt%) phosphorus which is completely softened even at a temperature of 800° to 900° C. Moreover, because, if high-resistance polysilicon directly contacts a high-concentration PSG film, the phosphorus in the PSG film diffuses in the high-resistance polysilicon to change the resistance value of the high-resistance polysilicon and increase the fluctuation of the resistance value, so that NSG (Nondoped Silicate Glass) is deposited between the high-resistance polysilicon and the high-concentration PSG film.

FIG. 17 is a graph in which X axis shows reflow temperature and Y axis shows channel surface boron concentration after thermal annealing. From FIG. 17, it is found that reflow at 900° C. or higher is possible because boron hardly diffuses in a silicon nitride film. Therefore, boron does not penetrate even if the reflow temperature is higher than 900° C. when the silicon nitride film is contained in a gate insulating film (e.g. ONO structure).

Moreover, because boron hardly diffuse for RTA (Rapid Thermal Annealing), a fabrication method is considered which is added with RTA at 900° C. or higher for a short time (total thermal annealing time of approx. 10 min or less) after source and drain regions are formed in the present invention. RTA has an advantage of activating impurities contained in a gate electrode and not activated yet which is decreasing a gate resistance. If the gate resistance can be decreased, operations of a semiconductor device can be accelerated. Moreover, to decrease the gate resistance, it is devised to connect a gate electrode with a metallic wire every certain interval (e.g. 50 μm) (backing of gate electrode by metallic wire) or form a two-layer structured gate electrode polysilicon and refractory metal.

(Embodiment 7)

Gate oxide film 1000A

The embodiment of the present invention is described below by referring to the accompanying drawings. FIGS. 18A to 18F and FIGS. 19A and 19C are sectional views showing the fabrication process of the seventh embodiment of the semiconductor device of the present invention.

First, an N well 2 is formed in a P-type (20 to 30 Ωcm) silicon substrate 1 through ion implantation (phosphorus 100 to 150 KeV 3 to 4 $E12/cm^2$) and thermal diffusion (1175° C. oxidation atmosphere 19 hr). Thereafter, a P-type region 3 and an N-type region 4 for device separation are formed through ion implantation (P-type region: boron 25 to 35 KeV 5.0 to 8.0 $E13/cm^2$, N-type region: phosphorus 60 to 120 KeV 1.0 to 2.0 $E12/cm^2$). Then, a field oxide film 5 (approx. 1μm) and a gate oxide film 6 (approx. 100 nm) are formed through thermal oxidation {FIG. 18A}, and ion implantation (N-channel enhancement-type boron 40 to 45 KeV 1 to 4 $E11/cm^2$, N-channel depression-type phosphorus 120 to 140 KeV 2 to 6 $E11/cm^2$, P-channel enhancement-type phosphorus 120 to 140 KeV 1 to 4 $E11/cm^2$) to a channel region for threshold voltage control is performed {FIG. 18B}, and a polysilicon film 7 is deposited (300 to 400 nm) {FIG. 18C}.

Then, high-resistance polysilicon 8 and polysilicon gate electrodes 10 and 11 are simultaneously formed through etching {FIG. 18D}, an oxide film is completely removed from the source and drain region through etching {FIG. 18E}, and an oxide film is formed again on the source and drain up to a thickness of 10 to 20 nm {FIG. 18F}.

Then, ion implantation for the resistance value control of high-resistance polysilicon (phosphorus 40 to 60 KeV 1 to 6 E14/cm$^2$) and ion implantation (N-channel side phosphorus 40 to 80 KeV 7.0 to 10.0 E15/cm$^2$, P-channel side boron 20 to 35 KeV 2.0 to 5.0 E15/cm$^2$) for introduction of impurities into gate electrodes and formation of source and drain regions at the N-channel side (polysilicon gate electrode 10 and source and drain region 12) and the N-channel side (polysilicon gate electrode 11 and source and drain region 13) are performed {FIG. 19A}. In this case, ions are also implanted into wiring polysilicon.

Then, NSG (Nondoped Silicate Glass) is deposited up to a thickness of 200 to 300 nm and moreover a PSG (Phosphosilicate Glass) film containing 8 to 12 wt% of phosphorus is deposited up to a thickness of 400 to 600 nm to perform the reflow of an inter-layer insulating film at a temperature of 800° to 900° C. for 30 min.

Finally, a contact hole and a metallic electrode are formed to obtain the circuit comprising high-resistance polysilicon and surface-channel-type polysilicon gate CMOS transistors {FIG. 19B}.

A main feature of this embodiment lies in the fact that a thick gate oxide film is completely removed from the surface of source and drain after forming polysilicon gate electrodes and an oxide film is formed again up to a thickness of 10 and 20 nm through thermal oxidation. That is useful for fabricating semiconductor devices comprising MOS transistors with a thick gate oxide film.

In general, high concentration impurities are introduced into the source and drain of MOS transistor in order to decrease the parasitic resistance of the source and drain regions.

When the gate oxide film thickness increases, ion implantation energy must be increased to introduce impurities into the source and drain at a high concentration. To increase the implantation energy, however, there are problems such as limitation of machine performance, charge-up, and penetration of boron into channel region.

Therefore, the oxide film thickness is set to 10 to 20 nm on the surface of source and drain without changing the thickness of a gate oxide film under a polysilicon gate electrode by using the gate electrode as a etching mask, so that impurities can be implanted into the source and drain at a high concentration even at an low energy.

The 10 to 20 nm thick oxide film of the source and drain is used for protection against external contamination. Furthermore, oxidation of polysilicon slightly increase the drain breakdown voltage (by approx. 2 V) by rounding the edge of gate polysilicon.

The oxide film thickness is set to 10 to 20 nm in order to prevent contaminated atoms from entering from the outside of the substrate. And to limit boron and $BF_2$ ion implantation energies to 35 KeV and 100 KeV respectively, no boron penetrates into the channel region.

The following advantages are obtained by the present invention.

The first advantage is that the MOS transistors channel leak currents are decreased by using the surface channel type and the operating voltage is lowered (e.g. a minimum operating voltage of a voltage detection is 0.35 V).

The second advantage is that a voltage detector and a voltage regulator are operated at a low voltage by using the low reference voltage circuit.

The third advantage is that setting the gate oxide film thickness to 20 to 100 nm and the acceptor concentration of the source/drain region of the MOS transistor to 0.5 to $1.5 \times 10^{26}/m^3$, and the donor concentration of the source/drain region of an NMOS transistor to 2.1 to $3.0 \times 10^{26}/m^3$ prevents the penetration of boron into channel regions and the increase of the source/drain resistance.

The fourth advantage is that the capacity of an insulating film increases, a high conductance is obtained, high current CMOS transistors are obtained, and boron in a gate electrode is prevented from penetrating into a channel region by using a silicon nitride film as the insulating film.

The fifth advantage is that the resistance value of high-resistance polysilicon is prevented from fluctuating due to thermal annealing by forming NSG between high-resistance polysilicon and flatly NSG film.

The sixth advantage is that 2 masks and 30 processes are saved. This corresponds to approx. 10% of all processes for existing fabrication of a voltage detector and a voltage regulator.

The seventh advantage is that boron is prevented from penetrating into a channel region by setting the polysilicon gate film thickness from 300 to 400 nm and the boron ion implantation energy to 20 to 35 KeV.

The eighth advantage is that boron is prevented from penetrating into a channel region by setting the polysilicon gate film thickness from 300 to 400 nm and the $BF_2$ ion implantation energy to 50 to 100 KeV.

The ninth advantage is that even if a gate oxide film has a large thickness, ions can be implanted into a source/drain region because ion implantation energy is controlled by forming a gate electrode through etching, thereafter completely removing an oxide film from source and drain regions through etching, then forming an oxide film up to a thickness of 20 nm through thermal oxidation, and setting boron and $BF_2$ ion implantation energies for the gate electrode to 20 to 35 KeV and 50 to 100 KeV, respectively.

The tenth advantage is that boron is prevented from penetrating into a channel region due to thermal diffusion by setting the gate oxide film thickness of 20 to 100 nm and every thermal annealing temperature after forming source and drain to 800° to 900° C.

The eleventh advantage is that the resistance values of source/drain region and polysilicon gate electrode are decreased by activating the impurities in silicon through RTA (Rapid Thermal Annealing). Boron in a gate electrode is prevented from penetrating into the channel region due to thermal diffusion.

What is claimed is:

1. A method for fabricating a semiconductor device having high-resistance polysilicon and low-resistance polysilicon on the surface of a substrate, wherein the high-resistance polysilicon serves as a resistance and the low-resistance polysilicon serves as a wire and a gate electrode of a MOS transistor, comprising the steps of:

forming a gate oxide film;

forming a polysilicon film;

simultaneously forming a resistance, a wire, and a gate electrode from the polysilicon film by etching using a resist as a mask;

introducing impurities into the polysilicon for controlling a resistance value thereof to thereby form a high-resistance polysilicon resistance through ion implantation;

introducing impurities into the polysilicon to thereby form a low-resistance polysilicon wire through ion implantation;

introducing n-type impurities into the polysilicon to thereby form a gate electrode of a PMOS transistor and source and drain regions of the PMOS transistor through ion implantation; and introducing p-type impurities into the polysilicon to thereby form a gate electrode of an NMOS transistor and source and drain regions of the NMOS transistor through ion implantation.

2. A method for fabricating a semiconductor device according to claim 1; comprising the steps of forming the polysilicon film up to a thickness of 300 to 400 nm and implanting boron ions into the polysilicon film at an energy of 20 to 35 KeV.

3. A method for fabricating a semiconductor device according to claim 1; comprising the steps of forming the polysilicon film up to a thickness of 300 to 400 nm and implanting $BF_2$ ions into the polysilicon film at an energy of 50 to 100 KeV.

4. A method for fabricating a semiconductor device according to claim 1; wherein a MOS transistor having a gate oxide film with a thickness of 40 nm or more is fabricated by completely removing only an oxide film from a source and drain region through etching after forming a gate electrode, and depositing another oxide film on the source and drain regions up to a thickness of 10 to 20 nm through thermal oxidation after removing the oxide film from the source and drain regions.

5. A method for fabricating a semiconductor device according to claim 1; comprising the steps of forming the gate oxide film up to a thickness of 20 to 100 nm and performing the reflow of an inter-layer insulating film in a temperature range of 800° to 900° C.

6. A method for fabricating a semiconductor device according to claim 1; wherein impurities are introduced into the polysilicon gate electrode and thereafter impurities in silicon are activated through RTA (Rapid Thermal Annealing).

7. A method for fabricating a semiconductor device according to claims 1; comprising the steps of forming the gate oxide film with a thickness of 20 to 100 nm, forming the gate electrodes with a thickness of 300 to 400 nm, introducing the n-type impurities into the source and drain regions of the PMOS transistor at a concentration of 0.5 to $1.5 \times 10^{26}/m^3$, and introducing the p-type impurities into the source and drain regions of the NMOS transistor at a concentration of 2.1 to $3.0 \times 10^{26}$ $1/m^3$.

8. A method for fabricating a semiconductor device according to claim 1; including forming an NSG (Nondoped Silicate Glass) film over the substrate to contact the high-resistance polysilicon resistance, and forming a PSG (Phosphosilicate Glass) film on the NSG film.

9. A method for fabricating a semiconductor device according to claim 8; including forming the NSG film up to a thickness of 200 to 300 nm, and forming the PSG film up to a thickness of 400 to 600 nm.

10. A method for fabricating a semiconductor device according to claims 1; wherein the n-type impurities are introduced into the source and drain regions of the PMOS transistor at a concentration of 0.5 to $1.5 \times 10^{26}/m^3$.

11. A method for fabricating a semiconductor device according to claim 1; wherein the p-type impurities are introduced into the source and drain regions of the NMOS transistor at a concentration of 2.0 to $3.0 \times 10^{26}/m^3$.

12. A method for fabricating a semiconductor device, comprising: forming a gate oxide film on the surface of a substrate; forming a polysilicon film over the gate oxide film; simultaneously forming a resistor region, a wire region, and a gate electrode region from the polysilicon film; forming the resistor region into a high-resistance polysilicon resistor through ion implantation; forming the wire region into a low-resistance polysilicon wire through ion implantation; introducing n-type impurities into a portion of the gate electrode region to form a gate electrode of a PMOS transistor and the source and drain regions of the PMOS transistor through ion implantation; and introducing p-type impurities into another portion of the gate electrode region to form a gate electrode of an NMOS transistor and the source and drain regions of the NMOS transistor through ion implantation.

13. A method for fabricating a semiconductor device according to claim 12; including forming the polysilicon film up to a thickness of 300 to 400 nm and implanting boron ions into the polysilicon film at an energy of 20 to 30 KeV.

14. A method for fabricating a semiconductor device according to claim 12; including forming the polysilicon film up to a thickness of 300 to 400 nm and implanting $BF_2$ ions into the polysilicon film at an energy of 50 to 100 KeV.

15. A method for fabricating a semiconductor device according to claim 12; including forming the gate oxide film up to a thickness of 20 to 100 nm and performing the reflow of an inter-layer insulating film in a temperature range of 800° to 900° C.

16. A method for fabricating a semiconductor device according to claim 12; including introducing impurities into the polysilicon gate electrode region and thereafter activating the impurities in the polysilicon through RTA (Rapid Thermal Annealing).

* * * * *